United States Patent
Pelrine et al.

(10) Patent No.: US 6,911,764 B2
(45) Date of Patent: Jun. 28, 2005

(54) ENERGY EFFICIENT ELECTROACTIVE POLYMERS AND ELECTROACTIVE POLYMER DEVICES

(75) Inventors: Ronald E. Pelrine, Boulder, CO (US); Roy D. Kornbluh, Palo Alto, CA (US); Joseph Stephen Eckerle, Redwood City, CA (US)

(73) Assignee: SRI International, Menlo Park, CA (US)

( * ) Notice: Subject to any disclaimer, the term of this patent is extended or adjusted under 35 U.S.C. 154(b) by 177 days.

(21) Appl. No.: 09/779,373

(22) Filed: Feb. 7, 2001

(65) Prior Publication Data
US 2002/0008445 A1 Jan. 24, 2002

Related U.S. Application Data
(60) Provisional application No. 60/181,404, filed on Feb. 9, 2000.

(51) Int. Cl.[7] .............................................. H01L 41/08
(52) U.S. Cl. ......................... 310/328; 310/330; 310/800
(58) Field of Search ................................. 310/324, 330, 310/331, 332, 328, 800

(56) References Cited

U.S. PATENT DOCUMENTS

| | | | | |
|---|---|---|---|---|
| 3,304,773 A | * | 2/1967 | Rogallo ....................... | 310/331 |
| 3,403,234 A | | 9/1968 | Barnes, Jr. | |
| 3,801,839 A | | 4/1974 | Yo | |
| 3,832,580 A | * | 8/1974 | Yamamuro et al. ..... | 310/800 X |
| 3,935,485 A | * | 1/1976 | Yoshida et al. ............. | 310/339 |
| 4,051,395 A | | 9/1977 | Taylor | |
| 4,170,742 A | * | 10/1979 | Itagaki et al. ................ | 310/324 |
| 4,315,433 A | * | 2/1982 | Edelman et al. ......... | 310/800 X |
| 4,384,394 A | | 5/1983 | Lemonon et al. | |
| 4,400,634 A | | 8/1983 | Micheron | |
| 4,401,911 A | | 8/1983 | Ravinet et al. | |

(Continued)

FOREIGN PATENT DOCUMENTS

| | | |
|---|---|---|
| DE | 19636909 C1 | 3/1998 |
| WO | WO 95/08905 | 3/1995 |
| WO | WO 98/35529 | 8/1998 |
| WO | WO 98/45677 | 10/1998 |
| WO | WO 01/06575 | 1/2001 |

OTHER PUBLICATIONS

Ajluni, Cheryl, "Pressure Sensors Strive to Stay on Top, New Silicon Micromachining Techniques and Designs Promise Higher Performance", *Electronic Design—Advanced Technology Series*, Oct. 3, 1994, pp. 67–74.

Anderson, R. A., "Mechanical Stress in a Dielectric Solid From a Uniform Electric Field", *The American Physical Society*, 1986, pp. 1302–1307.

Roy D. Kornbluh, Robotic Systems, Ocean Engineering and Marine Systems, 2000 Program, Jan. 2001, Office of Naval Research Public Release, ONR–32100–1.

(Continued)

*Primary Examiner*—Mark Budd
(74) *Attorney, Agent, or Firm*—Beyer Weaver & Thomas LLP

(57) ABSTRACT

The present invention relates to polymers that convert between electrical and mechanical energy. When a voltage is applied to electrodes contacting an electroactive polymer, the polymer deflects. This deflection may be used to do mechanical work. Similarly, when a previously charged electroactive polymer deflects, the electric field in the material is changed. The change in electric field may be used to produce electrical energy. An active area is a portion of a polymer having sufficient electrostatic force to enable deflection of the portion and/or sufficient deflection to enable a change in electrostatic force or electric field. The present invention relates to energy efficient transducers and devices comprising multiple active areas on one or more electroactive polymers. The invention also relates to methods for actuating one or more active areas on one or more electroactive polymers while maintaining a substantially constant potential energy.

35 Claims, 6 Drawing Sheets

U.S. PATENT DOCUMENTS

| | | | |
|---|---|---|---|
| 4,518,555 A | | 5/1985 | Ravinet et al. |
| 4,678,955 A | * | 7/1987 | Toda .......................... 310/328 |
| 4,686,440 A | * | 8/1987 | Hatamura et al. ...... 310/328 X |
| 4,839,872 A | * | 6/1989 | Gragnolati et al. ..... 310/800 X |
| 4,843,275 A | | 6/1989 | Radice |
| 4,877,957 A | * | 10/1989 | Okada et al. ................ 310/328 |
| 4,885,783 A | | 12/1989 | Whitehead et al. |
| 4,969,197 A | | 11/1990 | Takaya |
| 5,024,872 A | | 6/1991 | Wilson et al. |
| 5,170,089 A | * | 12/1992 | Fulton ......................... 310/328 |
| 5,229,979 A | | 7/1993 | Scheinbeim et al. |
| 5,250,784 A | | 10/1993 | Muller et al. |
| 5,254,296 A | | 10/1993 | Perlman |
| 5,356,500 A | | 10/1994 | Scheinbeim et al. |
| 5,430,565 A | | 7/1995 | Yamanouchi et al. |
| 5,440,194 A | * | 8/1995 | Beurrier ...................... 310/328 |
| 5,642,015 A | | 6/1997 | Whitehead et al. |
| 5,835,453 A | | 11/1998 | Wynne et al. |
| 5,902,836 A | | 5/1999 | Bennet et al. |
| 5,915,377 A | | 6/1999 | Coffee |
| 5,977,685 A | | 11/1999 | Kurita et al. |
| 6,048,622 A | | 4/2000 | Hagood et al. |
| 6,060,811 A | | 5/2000 | Fox et al. |
| 6,084,321 A | | 7/2000 | Hunter et al. |
| 6,140,740 A | * | 10/2000 | Porat et al. .................. 310/322 |
| 6,184,608 B1 | | 2/2001 | Cabuz et al. |
| 6,184,609 B1 | | 2/2001 | Johansson et al. |
| 6,249,076 B1 | | 6/2001 | Madden et al. |
| 6,359,370 B1 | * | 3/2002 | Chang ......................... 310/328 |
| 6,459,088 B1 | * | 10/2002 | Yasuda et al. .......... 310/328 X |

OTHER PUBLICATIONS

Roy D. Kornbluh, Robotic Systems, Ocean Engineering and Marine Systems, 1999 Program, Feb. 2000, Office of Naval Research Public Release, ONR 32100–2.

Roy D. Kornbluh, Robotic Systems, Ocean Engineering and Marine Systems,1998 Program, Feb. 1999 Office of Naval Research Public Release, ONR 32199–4.

Roy D. Kornbluh, Robotic Systems, Ocean Engineering and Marine Systems 1997 Program , Dec. 1997, Office of Naval Research Public Release, ONR 32198–2.

Aramaki, S., S. Kaneko, K. Arai, Y. Takahashi, H. Adachi, and K. Yanagisawa. 1995. "Tube Type Micro Manipulator Using Shape Memory Alloy (SMA)," *Proceedings of the IEEE Sixth International Symposium on Micro Machine and Human Science*, Nagoya, Japan, pp. 115–120.

Ashley, S., "Smart Skis and Other Adaptive Structures", *Mechanical Engineering*, Nov. 1995, pp. 77–81.

Bar–Cohen, Yoseph, JPL, *WorldWide ElectroActive Polymers, EAP (Artificial Muscles) Newsletter*, vol. 1, No. 1, Jun. 1999.

Bar–Cohen, Yoseph, JPL, *WorldWide ElectroActive Polymers, EAP (Artificial Muscles) Newsletter*, vol. 1, No. 2, Dec. 1999.

Bar–Cohen, Yoseph, JPL, *WorldWide ElectroActive Polymers, EAP (Artificial Muscles) Newsletter*, vol. 2, No. 1, Jul. 2000.

Bar–Cohen, Yoseph, JPL, *WorldWide ElectroActive Polymers, EAP (Artificial Muscles) Newsletter*, vol. 2, No. 2, Dec. 2000.

Bar–Cohen, Yoseph, JPL, *WorldWide ElectroActive Polymers, EAP (Artificial Muscles) Newsletter*, vol. 3, No. 1, Jun. 2001.

Bar–Cohen, Yoseph, JPL, *WorldWide Electroactive Polymer Actuators Webhub* webpages 1–7, http://ndeaa.jpl.nasa.gov/nasa–nde/lommas/eap/EAP–web.htm, downloaded Jul. 23, 2001.

Baughman, R., L. Shacklette, R. Elsenbaumer, E. Plichta, and C. Becht "Conducting Polymer Electromechanical Actuators," *Conjugated Polymeric Materials: Opportunities in Electronics, Optoelectronics and Molecular Electronics*, eds. J.L. Bredas and R.R. Chance, Kluwer Academic Publishers, The Netherlands, pp. 559–582, 1990.

Baughman, R.H., L.W. Shacklette, and R.L. Elsenbaumer, E.J. Plichta, and C. Becht, "Micro electromechanical actuators based on conducting polymers", in *Molecular Electronics, Materials and Methods*, P.I. Lazarev (ed.), Kluwer Academic Publishers, pp. 267–289 (1991).

Bharti, V., Y. Ye, T.–B. Xu and Q. M. Zhang, "Correlation Between Large Electrostrictive Strain and Relaxor Behavior with Structural Changes Induced in P(VDF–TrFE) Copolymer by electron Irradiation," Mat. Res. Soc. Symp. Proc. vol. 541, pp. 653–659 (1999).

Bharti, V., Z.–Y. Cheng, S. Gross, T.–B. Xu, and Q. M. Zhang, "High electrostrictive strain under high mechanical stress in electron–irradiated poly(vinylidene fluoride–trifluoroethylene) copolymer," *Appl. Phys. Lett*. vol. 75, 2653–2655 (Oct. 25, 1999).

Bharti, V., H. S. Xu, G. Shanthi, and Q. M. Zhang, "Polarization and Structural Properties of High Energy Electron Irradiated Poly(vinylidene fluoride–trifluoroethylene) Copolymer Films," to be published in J. Appl. Phys. (2000).

Bharti, V., X.–Z. Zhao, Q. M. Zhang, T. Romotowski, F. Tito, and R. Ting, "Ultrahigh Field Induced Strain And Polarization Response In Electron Irradiated Poly(Vinylidene Fluoride–Trifluoroethylene) Copolymer," *Mat. Res. Innovat.* vol. 2, 57–63 (1998).

Bobbio, S., M Kellam, B. Dudley, S. Goodwin Johansson, S. Jones, J. Jacobson, F. Tranjan, and T. DuBois, "Integrated Force Arrays," in Proc. IEEE Micro ElectroMechanical Systems Workshop, Fort Lauderdale, Florida Feb. 1993.

Bohon, K., and S. Krause, "An Electrorheological Fluid and Siloxane Gel Based Electromechanical Actuator: Working Toward an Artificial Muscle," to be published in *J. Polymer Sci., Part B. Polymer Phys.* (2000).

Brock, D. L., "Review of Artificial Muscle based on Contractile Polymers," MIT Artificial Intelligence Laboratory, A.I. Memo No. 1330, Nov. 1991.

Caldwell, D., G. Medrano–Cerda, and M. Goodwin, "Characteristics and Adaptive Control of Pneumatic Muscle Actuators for a Robotic Elbow," Proc. IEEE Int. Conference on Robotics and Automation, San Diego, California (May 8–13, 1994).

Calvert, P. and Z. Liu, "Electrically stimulated bilayer hydrogels as muscles," Proceedings of the SPIE International Symposium on Smart Structures and Materials: Electro–Active Polymer Actuators and Devices, Mar. 1–2, 1999, Newport Beach, California, USA, pp. 236–241.

Cheng, Z.–Y., H. S. Xu, J. Su, Q. M. Zhjang, P.–C. Wang, and A. G. MacDiarmid, "High performance of all–polymer electrostrictive systems," Proceedings of the SPIE International Symposium on Smart Structures and Materials: Electro–Active Polymer Actuators and Devices, Mar. 1–2, 1999, Newport Beach, California, USA., pp. 140–148.

Cheng, Z.-Y., T.-B. Xu, V. Bharti, S. Wang, and Q. M. Zhang, "Transverse Strain Responses In The Electrostrictive Poly(Vinylidene Fluoride–Trifluorethylene) Copolymer," *Appl. Phys. Lett.* vol. 74, No. 13, pp. 1901–1903, Mar. 29, 1999.

Chiarelli, P., A. Della Santa, D. DeRossi, and A. Mazzoldi. 1995. "Actuation Properties of Electrochemically Driven Polypyrrole Free–standing Films," *Journal of Intelligent Material Systems and Structures*, vol. 6, pp. 32–37, Jan. 1995.

De Rossi, D., and P. Chiarelli. 1994. "Biomimetic Macromolecular Actuators," *Macro–Ion Characterization, American Chemical Society Symposium Series*, vol. 548, Ch. 40, pp. 517–530.

Dowling, K., *Beyond Faraday–Non Traditional Actuation*, available on the World Wide Web at http://www.frc.ri.cmu.edu/~nivek/OTH/beyond–faraday/beyondfaraday.html, 9 pages, 1994.

Egawa, S. and T. Higuchi, "Multi–Layered Electrostatic Film Actuator," Proc. IEEE Micro Electra Mechanical Systems, Napa Valley, California, pp. 166–171 (Feb. 11–14, 1990).

Elhami, K., and B. Gauthier–Manuel, "Electrostriction Of The Copolymer Of Vinylidene–Fluoride And Trifluoroethylene," *J. Appl. Phys.* vol. 77 (8), 3987–3990, Apr. 15, 1995.

Flynn, Anita M., L.S. Tavrow, S.F. Bart, R.A. Brooks, D.J. Ehrlich, K.R. Udayakumar, and L.E. Cross. 1992. "Piezoelectric Micromotors for Microrobots," *IEEE Journal of Microelectromechanical Systems*, vol. 1, No. 1, pp. 44–51 (Mar. 1992); also published as *MIT Al Laboratory Memo 1269*, Massachusetts Institute of Technology (Feb. 1991).

Full, R. J. and K. Meijer, "Artificial Muscles Versus Natural Actuators From Frogs To Flies," Proceedings of the 7th SPIE Symposium on Smart Structures and Materials–Electroactive Polymers and Devices (EAPAD) Conference, Mar. 6–8, 2000, Newport Beach, California, USA, pp. 2–9.

Furuhata, T., T. Hirano, and H. Fujita, "Array–Driven Ultrasonic Microactuators," Solid State Sensors and Actuators, 1991, Digest of Tech. Papers, Transducers, pp. 1056–1059.

Furukawa, T., and N. Seo., "Electrostriction as the Origin of Piezoelectricity in Ferroelectric Polymers," *Japanese J. Applied Physics*, vol. 29, No. 4, pp. 675–680 (Apr. 1990).

Gilbertson, R.G., and J.D. Busch. 1994. "Survey of Micro–Actuator Technologies for Future Spacecraft Missions," presented at the conference entitled "Practical Robotic Interstellar Flight: Are We Ready?" New York University and The United Nations, New York. (Aug. 29 and Sep. 1, 1994); also published on the World Wide Web at http://nonothinc.com/nanosci/microtech/mems/ten–actuators/gilbertson.html.

Goldberg, Lee, Adaptive–Filtering Developments Extend Noise–Cancellation Applications, *Electronic Design*, Feb. 6, 1995, pp. 34 and 36.

M. Greene and J. A. Willett, and Kornbluh, R., "Robotic systems," in ONR Report 32198–2, Ocean Engineering and Marine Systems 1997 Program (Dec. 1997).

Heydt, R., R. Pelrine, J. Joseph, J. Eckerle, and R. Kornbluh. "Acoustical Performance of an Electrostrictive Polymer Film Loudspeaker", *Journal of the Acoustical Society of America* vol. 107, pp. 833–839 (Feb. 2000).

Heydt, R., R. Kornbluh, R. Pelrine, and B. Mason, "Design and Performance of an Electrostrictive Polymer Film Acoustic Actuator", *Journal of Sound and Vibration* (1998)215(2), 297–311.

Hirano, M., K. Yanagisawa, H. Kuwano, and S. Nakano, "Microvalve with Ultra–low Leakage," Tenth Annual International Workshop on Micro Electromechanical Systems, Nagoya, Japan, *IEEE Proceedings* (Jan. 26–30, 1997), pp. 323–326.

Hirose, S., Biologically Inspired Robots: Snake–like Locomotors and Manipulators, *"Development of the ACM as a Manipulator"*, Oxford University Press, New York, 1993, pp. 170–172.

Hunter, I., S. Lafontaine, J. Hollerbach, and P. Hunter, "Fast Reversible NiTi Fibers for Use in MicroRobotics," *Proc. 1991 IEEE Micro Electro Mechanical Systems–MEMS '91*, Nara, Japan, pp. 166–170.

Hunter, I.W., and S. Lafontaine, "A Comparison of Muscle with Artificial Actuators", *Technical Digest of the IEEE Solid–state Sensor and Actuator Workshop*, Hilton Head, South Carolina, Jun. 22–25, 1992, pp. 178–185.

Jacobsen, S., Price, R., Wood, J, Rytting, T., and Rafaelof, M., "A Design Overview of an Eccentric–Motion Electrostatic Microactuator (the Wobble Motor)", *Sensors and Actuators*, 20 (1989) pp. 1–16.

Kaneto, K., M. Kaneko, Y. Min, and A.G. MacDiarmid. 1995. "'Artificial Muscle': Electromechanical Actuators Using Polyaniline Films," *Synthetic Metals 71*, pp. 2211–2212, 1995.

Kawamura, S., K. Minani, and M. Esashi, "Fundamental Research of Distributed Electrostatic Micro Actuator," Technical Digest of the 11th Sensor Symposium, pp. 27–30(1992).

Kondoh Y., and T. Ono. 1991. "Bimorph Type Actuators using Lead Zinc Niobate–based Ceramics," *Japanese Journal of Applied Physics*, vol. 30, No. 9B, pp. 2260–2263, Sep. 1991.

Kornbluh, R., R. Pelrine, R. Heydt, and Q. Pei, "Acoustic Actuators Based on the Field–Activated Deformation of Dielectric Elastomers," (2000).

Kornbluh, R., G. Andeen, and J. Eckerle, "Artificial Muscle: The Next Generation of Robotic Actuators," presented at the Fourth World Conference on Robotics Research, SME Paper M591–331, Pittsburgh, PA, Sep. 17–19, 1991.

Kornbluh, R., R. Pelrine, J. Joseph, "Elastomeric Dielectric Artificial Muscle Actuators for Small Robots," *Proceedings of the Third IASTED International Conference on Robotics and Manufacturing*, Jun. 14–16, 1995, Cancun, Mexico.

Kornbluh, R., Pelrine, R., Eckerie, J., Joseph, J., "Electrostrictive Polymer Artificial Muscle Actuators", IEEE International Conference on Robotics and Automation, Leuven, Belgium, 1998.

Kornbluh, R., R. Pelrine, Jose Joseph, Richard Heydt, Qibing Pei, Seiki Chiba, 1999. "High–Field Electrostriction Of Elastomeric Polymer Dielectrics For Actuation", Proceedings of the SPIE International Symposium on Smart Structures and Materials: Electro–Active Polymer Actuators and Devices, Mar. 1–2, 1999, Newport Beach, California, USA. pp. 149–161.

Kornbluh, R. D and R. E. Pelrine., "Dexterous Multiarticulated Manipulator with Electrostrictive Polymer Artificial Muscle," ITAD–7247–QR–96–175, SRI Project No. 7247, Prepared for: Office of Naval Research, Nov. 1996.

Kornbluh, R., R. Pelrine, Q. Pei, S. Oh, and J. Joseph, 2000. "Ultrahigh Strain Response of Field–Actuated Elastomeric Polymers," Proceedings of the 7th SPIE Symposium on Smart Structures and Materials–Electroactive Polymers and Devices (EAPAD) Conference, Mar. 6–8, 2000, Newport Beach, California, USA, pp. 51–64.

Kornbluh, R., Pelrine, R. Joseph, J., Pei, Q. and Chiba, S., "Ultra–High Strain Response of Elastomeric Polymer Dielectrics", Proc. Materials Res. Soc., Fall meeting, Boston, MA, pp. 1–12, Dec. 1999.

Ktech's PVDF Sensors, http://www.ktech.com/pvdf.htm, Jun. 6, 2001, pp. 1–5.

Lang, J, M. Schlect, and R. Howe, "Electric Micromotors: Electromechanical Characteristics," Proc. IEEE Micro Robots and Teleoperators Workshop, Hyannis, Massachusetts (Nov. 9–11, 1987).

Liu, Y., T. Zeng, Y.X. Wang, H. Yu, and R. Claus, "Self–Assembled Flexible Electrodes on Electroactive Polymer Actuators," Proceedings of the SPIE International Symposium on Smart Structures and Materials: Electro–Active Polymer Actuators and Devices, Mar. 1–2, 1999, Newport Beach, California, USA., pp. 284–288.

Liu, C., Y. Bar–Cohen, and S. Leary, "Electro–statically stricted polymers (ESSP)," Proceedings of the SPIE International Symposium on Smart Structures and Materials: Electro–Active Polymer Actuators and Devices, Mar. 1–2, 1999, Newport Beach, California, USA., pp. 186–190.

Lawless, W. and R. Arenz, "Miniature Solid–state Gas Compressor," Rev. Sci Instrum., 58(8), pp. 1487–1493, Aug. 1987.

Martin, J. and R. Anderson, 1999. "Electrostriction In Field–Structured Composites: Basis For A Fast Artificial Muscle?", Journal of Chemical Physics, vol. 111, No. 9, pp. 4273–4280, Sep. 1, 1999.

Measurements Specialties, Inc.—Piezo Home, http://www.msiusa.com/piezo/index.htm, Jun. 6, 2001.

T. B. Nguyen, C. K. DeBolt, Shastri, S. V., and A. Mann, "Advanced Robotic Search," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Nguyen, T., Green, M., and Kornbluh, R., "Robotic Systems," in ONR Ocean, Atmosphere, and Space Fiscal Year 1999 Annual Reports (Dec. 1999).

Ohara, K., M. Hennecke, and J. Fuhrmann, "Electrostriction of polymethylmethacrylates," Colloid & Polymer Sci. vol. 280, 164–168 (1982).

Olsson, A., O. Larsson, J. Holm, L. Lundbladh, O. Ohinan, and G. Stemme. 1997. "Valve–less Diffuser Micropumps Fabricated using Thermoplastic Replication," Proc. IEEE Micro Electro Mechanical Systems, Nagoya, Japan, pp. 305–310 (Jan. 26–30, 1997).

Olsson, A., G. Stemme, and E. Stemme, "The First Valve–less Diffuser Gas Pump," Tenth Annual International Workshop on Micro Electromechanical Systems, Nagoya, Japan, IEEE Proceedings (Jan. 26–30, 1997), pp. 108–113.

Otero, T.F., J. Rodriguez, E. Angulo and C. Santamaria, "Artificial Muscles from Bilayer Structures," Synthetic Metals, vol. 55–57, pp. 3713–3717 (1993).

Otero, T.F., J. Rodriguez, and C. Santamaria, "Smart Muscle Under Electrochemical Control of Molecular Movement in Polypyrrole Films," Materials Research Society Symposium Proceedings, vol. 330, pp. 333–338, 1994.

Park, S.E., and T. Shrout., "Ultrahigh Strain and Piezoelectric Behavior in Relaxor Based Ferroelectric Single Crystals," J Applied Physics, vol. 82, pp. 1804–1811, Aug. 15, 1997.

Pei, Q., O. Inganäs, and I. Lundström, "Bending Bilayer Strips Built From Polyaniline For Artificial Electrochemical Muscles," Smart Materials and Structures, vol. 2, pp. 16., Jan. 22, 1993.

Pei et al., "Improved Electroactive Polymers", U.S. Appl. No. 09/619,847, filed Jul. 20, 2000, 70 pages.

R. Pelrine and Kornbluh, R., and. 1995. "Dexterous Multi-articulated Manipulator with Electrostrictive Polymer Artificial Muscle Actuator, " EMU 95–023, SRI International, Menlo Park, California, Apr. 28, 1995.

Pelrine, R., R. Kornbluh, and Q. Pei. "Electroactive Polymer Transducers And Actuators", U.S. Appl. No. 09/620,025, filed Jul. 20, 2001, 58 pages.

Pelrine, R. and Kornbluh, "Electroactive Polymer Devices", U.S. Appl. No. 09/619,846, filed Jul. 20, 2000, 67 pages.

Pelrine et al., "Electroactive Polymer Electrodes", U.S. Appl. No. 09/619,843, filed Jul. 20, 2000, 54 pages.

Pelrine et al., "Electroactive Polymer Fabrication", U.S. Appl. No. 09/619,845, filed Jul. 20, 2000, 55 pages.

Pelrine et al., "Electroactive Polymer Generators", U.S. Appl. No. 09/619,848, filed Jul. 20, 2000, 69 pages.

Pelrine, R., R. Kornbluh, and J. Joseph, "Electrostriction of Polymer Dielectrics with Compliant Electrodes as a Means of Actuation," Sensors and Actuators A : Physical, vol. 64, 1998, pp. 77–85.

Pelrine, R, R. Kornbluh, J. Joseph, and S. Chiba, "Electrostriction of Polymer Films for Microactuators," Proc. IEEE Tenth Annual International Workshop on Micro Electro Mechanical Systems, Nagoya, Japan, Jan. 26–30, 1997, pp. 238–243.

Pelrine, R., R. Kornbluh, and J. Eckerle. "Monolithic Electroactive Polymers", U.S. Appl. No. 09/779,203, filed Feb. 7, 2001.

Pelrine, R., and J. Joseph, FY 1992 Final Report on Artificial Muscle for Small Robots, ITAD–3393–FR–93–063, SRI International, Menlo Park, California, Mar. 1993.

Pelrine, R., and J. Joseph. 1994. FY 1993 Final Report on Artificial Muscle for Small Robots, ITAD–4570–FR–94–076, SRI International, Menlo Park, California.

Pelrine, R., R. Kornbluh, and J. Joseph, FY 1994 Final Report on Artificial Muscle for Small Robots, ITAD–5782–FR–95–050, SRI International, Menlo Park, California, 1995.

Pelrine, R., R. Kornbluh, and J. Joseph, FY 1995 Final Report on Artificial Muscle for Small Robots, ITAD–7071 –FR–96–047, SRI International, Menlo Park, California, 1996.

Pelrine, R., R. Kornbluh, and J. Joseph, FY 1996 Final Report on Artificial Muscle for Small Robots, ITAD–7228–FR–97–058, SRI International, Menlo Park, California, 1997.

Pelrine, R., R. Kornbluh, and J. Joseph, FY 1997 Final Report on Artificial Muscle for Small Robots, ITAD–1612–FR–98–041, SRI International, Menlo Park, California, 1998.

Pelrine, R., R. Kornbluh, and J. Joseph, FY 1998 Final Report on Artificial Muscle for Small Robots, ITAD–3482–FR–99–36, SRI International, Menlo Park, California, 1999.

Pelrine, R., R. Kornbluh, and J. Joseph, FY 1999 *Final Report on Artificial Muscle for Small Robots*, ITAD–10162–FR–00–27, SRI International, Menlo Park, California, 2000.

Pelrine, R., R. Kornbluh, Q. Pei, and J. Joseph. "High–Speed Electrically Actuated Elastomers with Strain Greater Than 100%", *Science*, Reprint Series, Feb. 4, 2000, vol. 287, pp. 836–839.

Pelrine, R., R. Kornbluh, Q. Pei, and J. Joseph, "High Speed Electrically Actuated Elastomers with Over 100% Strain," *Science*, vol. 287, No. 5454, pp. 1–21, 2000.

Pelrine, R., R. Kornbluh, and G. Kofod, "High Strain Actuator Materials Based on Dielectric Elastomers," submitted to *Advanced Materials* (May 2000).

Pelrine, R., Roy Kornbluh, Jose Joseph, Qibing Pei, Seiki Chiba "Recent Progress in Artificial Muscle Micro Actuators,", SRI International, Tokyo, 1999 MITI/NEEDOIM-NIC, 1999.

Pelrine, R., J. Eckerle, and S. Chiba, "Review of Artificial Muscle Approaches," invited paper, in *Proc. Third International Symposium on Micro Machine and Human Science*, Nagoya, Japan, Oct. 14–16, 1992.

Piezoflex™ PVDF Polymer Sensors, http://www.airmar.com/piezo/pvdf.htm, Jun. 6, 2001.

Scheinbeim, J., B. Newman, Z. Ma, and J. Lee, "Electrostrictive Response of Elastomeric Polymers," *ACS Polymer Preprints*, 33(2), pp. 385–386, 1992.

Schlaberg, H. I., and J. S. Duffy, "Piezoelectric Polymer Composite Arrays For Ultrasonic Medical Imaging Applications," *Sensors and Actuators*, A 44, pp. 111–117, Feb. 22, 1994.

Shahinpoor, M., "Micro–electro–mechanics of Ionic Polymer Gels as Electrically Controllable Artificial Muscles," *J. Intelligent Material Systems and Structures*, vol. 6, pp. 307–314, May 1995.

Shkel, Y., and D. Klingenberg, "Materials Parameters for Electrostriction," *J Applied Physics*, vol. 80(8), pp. 4566–4572, Oct. 15, 1996.

Smela, E., O. Inganäs, and I. Lundström, "Controlled Folding of Micrometer–size Structures," *Science*, vol. 268, pp. 1735–1738 (Jun. 23, 1995).

Smela, E., O. Inganäs, Q. Pei, and I. Lundström, "Electrochemical Muscles: Micromachining Fingers and Corkscrews, "*Advanced Materials*, vol. 5, No. 9, pp. 630–632, Sep. 1993.

Su, J., Q. M. Zhang, C. H. Kim, R. Y. Ting, and R. Capps, "Effects of Transitional Phenomena on the Electric Field induced Strain–electrostrictive Response of a Segmented Polyurethane Elastomer," pp. 1363–1370, Jan. 20, 1997.

Su, J., Z. Ounaies, J. S. Harrison, Y. Bara–Cohen and S. Leary, "Electromechanically Active Polymer Blends for Actuation," Proceedings of the 7th SPIE Symposium on Smart Structures and Materials–Electroactive Polymers and Devices (EAPAD) Conference, Mar. 6–8, 2000, Newport Beach, California, USA, pp. 65–72.

Technology, http://www.micromuscle.com/html/technology.html, Jun. 6, 2001.

Tobushi, H., S. Hayashi, and S. Kojima, "Mechanical Properties of Shape Memory Polymer of Polyurethane Series," in *JSME International Journal*, Series I, vol. 35, No. 3, 1992.

Treloar, L.R.G, "Mechanics of Rubber Elasticity," *J Polymer Science, Polymer Symposium*, No. 48, pp. 107–123, 1974.

Uchino, K. 1986. "Electrostrictive Actuators: Materials and Application," *Ceramic Bulletin*, 65(4), pp. 647–652, 1986.

Wade, W. L., Jr., R. J. Mammone and M. Binder, "Increased Dielectric Breakdown Strengths Of Melt–Extruded Polyporpylene Films," *Polymer*, vol. 34, No. 5, pp. 1093–1094 (1993).

Wax, S. G. and R. R. Sands, "Electroactive Polymer Actuators and Devices," Proceedings of the SPIE International Symposium on Smart Structures and Materials: Electro–Active Polymer Actuators and Devices, Mar. 1–2, 1999, Newport Beach, California, USA., pp. 2–10.

Winters, J., "Muscle as an Actuator for Intelligent Robots", Robotics Research: Trans. Robotics International of SME, Scottsdale, AZ (Aug. 18–21, 1986).

Yam, P., "Plastics Get Wired", *Scientific American*, vol. 273, pp. 82–87, Jul. 1995.

Zhang, Q. M., V. Bharti, Z.–Y. Cheng, T.–B. Xu, S. Wang, T. S. Ramotowski, F. Tito, and R. Ting, "Electromechanical Behavior of Electroactive P(VDF–TrFE) Copolymers," Proceedings of the SPIE International Symposium on Smart Structures and Materials: Electro–Active Polymer Actuators and Devices, Mar. 1–2, 1999, Newport Beach, California, USA., pp. 134–139.

Zhang, Q., V. Bharti, and X. Zhao, "Giant Electrostriction and Relaxor Ferroelectric Behavior in Electron–irradiated Poly(vinylidene fluoride–trifluoroethylene) Copolymer," *Science*, vol. 280, pp. 2101–2104 (Jun. 26, 1998).

Zhang, Q. M., Z.–Y. Cheng, V. Bharti, T.–B. Xu, H. Xu, T. Mai, and S. J. Gross, "Piezoelectric And Electrostrictive Polymeric Actuator Materials," Proceedings of the 7th SPIE Symposium on Smart Structures and Materials–Electroactive Polymers and Devices (EAPAD) Conference, Mar. 6–8, 2000, Newport Beach, California, USA, pp. 34–50.

Zhenyi, M., J.I. Scheinbeim, J.W. Lee, and B.A. Newman. 1994. "High Field Electrostrictive Response of Polymers," *Journal of Polymer Sciences, Part B–Polymer Physics*, vol. 32, pp. 2721–2731, 1994.

* cited by examiner

ENERGY EFFICIENT ELECTROACTIVE POLYMERS AND ELECTROACTIVE POLYMER DEVICES

CROSS-REFERENCE TO RELATED APPLICATION

This application claims priority under 35 U.S.C. §119(e) from co-pending U.S. Provisional Patent Application No. 60/181,404 filed Feb. 9, 2000, which is incorporated by reference for all purposes.

U.S. GOVERNMENT RIGHTS

This application was made in part with government support under contract number N00014-96-C-0026 awarded by the Office of Naval Research. The government has certain rights in the invention.

BACKGROUND OF THE INVENTION

The present invention relates generally to electroactive polymers that convert between electrical energy and mechanical energy. More particularly, the present invention relates to energy efficient electroactive polymers and electroactive polymer devices. The present invention also relates to methods of using electroactive polymers and electroactive polymer devices to increase mechanical or electrical output.

In many applications, it is desirable to convert between electrical energy and mechanical energy. Exemplary applications requiring conversion from electrical to mechanical energy include robotics, pumps, speakers, general automation, disk drives and prosthetic devices. These applications include one or more actuators that convert electrical energy into mechanical work—on a macroscopic or microscopic level. Common actuator technologies, such as electromagnetic motors and solenoids, are not suitable for many of these applications, e.g., when the required device size is small (e.g., micro or mesoscale machines) or the weight or complexity must be minimized. Exemplary applications requiring conversion from mechanical to electrical energy include sensors and generators. These applications include one or more transducers that convert mechanical energy into electrical energy. Common electric generator technologies, such as electromagnetic generators, are also not suitable for many of these applications, e.g., when the required device size is small (e.g., in a person's shoe). These transducer technologies are also not ideal when a large number of devices must be integrated into a single structure or under various performance conditions such as when high power density output is required at relatively low frequencies.

Several 'smart materials' have been used to convert between electrical and mechanical energy with limited success. These smart materials include piezoelectric ceramics, shape memory alloys and magnetostrictive materials. However, each smart material has a number of limitations that prevent its broad usage. Certain piezoelectric ceramics, such as lead zirconium titanate (PZT), have been used to convert electrical to mechanical energy. While having suitable efficiency for a few applications, these piezoelectric ceramics are typically limited to a strain below about 1.6 percent and are often not suitable for applications requiring greater strains than this. In addition, the high density of these materials often eliminates them from applications requiring low weight. Irradiated polyvinylidene difluoride (PVDF) is an electroactive polymer reported to have a strain of up to 4 percent when converting from electrical to mechanical energy. Similar to the piezoelectric ceramics, the PVDF is often not suitable for applications requiring strains greater than 4 percent. Shape memory alloys, such as nitinol, are capable of large strains and force outputs. These shape memory alloys have been limited from broad use by unacceptable energy efficiency, poor response time and prohibitive cost.

In addition to the performance limitations of piezoelectric ceramics and irradiated PVDF, their fabrication often presents a barrier to acceptability. Single crystal piezoelectric ceramics must be grown at high temperatures coupled with a very slow cooling down process. Irradiated PVDF must be exposed to an electron beam for processing. Both these processes are expensive and complex and may limit acceptability of these materials.

In view of the foregoing, alternative devices that convert between electrical and mechanical energy would be desirable.

SUMMARY OF THE INVENTION

In one aspect, the present invention relates to polymers that convert between electrical and mechanical energy. When a voltage is applied to electrodes contacting an electroactive polymer, the polymer deflects. This deflection may be used to do mechanical work. Similarly, when a previously charged electroactive polymer deflects, the electric field in the material is changed. The change in electric field may be used to produce electrical energy. An active area is a portion of a polymer having sufficient electrostatic force to enable deflection of the portion and/or sufficient deflection to enable a change in electrostatic force or electric field. The present invention relates to energy efficient transducers and devices comprising multiple active areas on one or more electroactive polymers. The invention also relates to methods for deflecting one or more active areas on one or more electroactive polymers. These methods may result in improved deflection and sometimes improved energy conversion efficiency. In one embodiment, the present invention relates to electroactive polymer transducers and devices that include deflection of an active area that is assisted by mechanical input energy. The mechanical input energy may come from another portion of the polymer, a portion of another polymer, and/or a mechanism coupled to the polymer. In another embodiment, the present invention relates to electroactive polymer transducers and devices that are arranged such that elastic potential energy of the device or transducer is substantially independent of deflection of a first portion of the polymer.

In another aspect, the invention relates to a device for converting between electrical energy and mechanical energy. The device comprises at least one electroactive polymer having a first active area. The first active area comprises at least two first active area electrodes and a first portion of the at least one electroactive polymer. The first portion is arranged in a manner which causes the first portion to deflect in response to a change in electric field provided by the at least two first active area electrodes and/or arranged in a manner which causes a change in electric field in response to deflection of the first portion. The device is arranged such that deflection of the portion in response to a change in electric field and/or deflection of the first portion causing a change in electric field is at least partially assisted by mechanical input energy.

In yet another aspect, the invention relates to a device for converting between electrical energy and mechanical energy. The device comprises at least one electroactive polymer. The at least one electroactive polymer comprises a first active area. The first active area comprising at least two first active area electrodes and a first portion of the at least one electroactive polymer. The first portion is arranged in a manner which causes the first portion to deflect in response to a change in electric field provided by the at least two first active area electrodes and/or arranged in a manner which causes a change in electric field in response to deflection of the first portion. The at least one electroactive polymer is arranged such that elastic potential energy of the device is substantially independent of deflection of the first portion in response to a change in electric field and/or deflection of the first portion causing a change in electric field.

In still another aspect, the invention relates to a method of using at least one electroactive polymer. The at least one electroactive polymer comprises a first active area, the first active area comprising at least two first active area electrodes and a first portion of the at least one electroactive polymer. The method comprising deflecting the first portion such that elastic potential energy of the at least one electroactive polymer is substantially constant for the deflection.

These and other features and advantages of the present invention will be described in the following description of the invention and associated figures.

DETAILED DESCRIPTION OF THE PREFERRED EMBODIMENTS

Figure 1A:
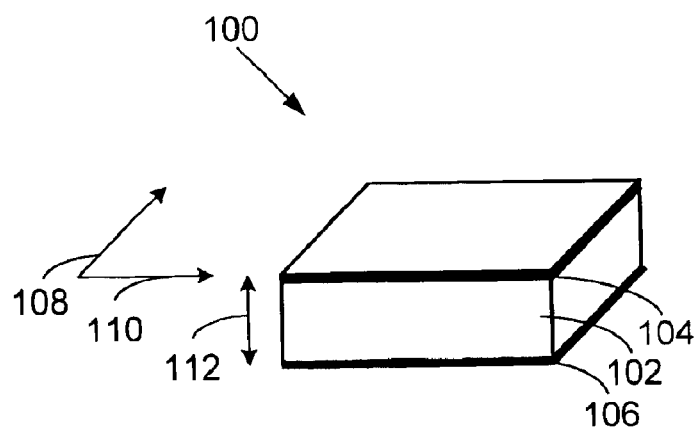
FIGS. 1A and 1B illustrate a top perspective view of a transducer portion before and after application of a voltage, respectively, in accordance with one embodiment of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

1. Overview

Electroactive polymers convert between mechanical and electrical energy. In one embodiment, the present invention relates to electroactive polymer transducers and devices that comprise deflection of an active area that is assisted by mechanical input energy. The mechanical input energy may come from another portion of the polymer, a portion of another polymer, and/or a mechanical energy input device coupled to the polymer. In another embodiment, the present invention relates to electroactive polymer transducers and devices that are arranged such that elastic potential energy of the device or transducer is substantially independent of deflection of a first portion of the polymer. These transducers and devices may be used in a variety of ways. In a specific embodiment, multiple active areas on a single electroactive polymer may be independently actuated to deflect a portion of the polymer along a two-dimensional path while keeping a substantially constant elastic potential energy. The two-dimensional path may be a circular path used in driving a crank in a motor. Combining different ways to arrange active areas and polymers, different ways to constrain a polymer, scalability of electroactive polymers to both micro and macro levels, and different polymer orientations (e.g., rolling or stacking individual polymer layers) permits a broad range of actuators, motors, sensors and generators that convert between electrical and mechanical energy. These devices find use in a wide range of applications.

For ease of understanding, the present invention is mainly described and shown by focusing on a single direction of energy conversion. More specifically, the present invention focuses on converting electrical energy into mechanical energy, i.e., when a transducer is operating in an actuator. However, in all the figures and discussions for the present invention, it is important to note that the polymers and devices may convert between electrical energy and mechanical energy bi-directionally. Thus, any of the polymer materials, polymer configurations, transducers, and devices described herein are also a transducer for converting mechanical energy to electrical energy (generator mode). Similarly, any of the exemplary electrodes described herein may be used with a generator of the present invention. Typically, a generator of the present invention comprises a polymer arranged in a manner that causes a change in electric field in response to deflection of a portion of the polymer. The change in electric field, along with changes in the polymer dimension in the direction of the field, produces a change in voltage, and hence a change in electrical energy.

For a transducer having a substantially constant thickness, one mechanism for differentiating the performance of the transducer, or a portion of the transducer associated with a single active area, as being an actuator or a generator is in the change in net area orthogonal to the thickness associated with the polymer deflection. For these transducers or active areas, when the deflection causes the net area of the transducer/active area to decrease and there is charge on the electrodes, the transducer/active area is converting from mechanical to electrical energy and acting as a generator. Conversely, when the deflection causes the net area of the transducer/active area to increase and charge is on the electrodes, the transducer/active area is converting electrical to mechanical energy and acting as an actuator. The change in area in both cases corresponds to a reverse change in film thickness, i.e. the thickness contracts when the planar area expands, and the thickness expands when the planar area contracts. Both the change in area and change in thickness affect the amount of energy that is converted between electrical and mechanical. Since the effects due to a change in area and corresponding change in thickness are complementary, only the change in area will be discussed herein for sake of brevity. In addition, although deflection of an electroactive polymer will primarily be discussed as a net increase in area of the polymer when the polymer is being used in an actuator to produce mechanical energy, it is understood that in some cases (i.e. depending on the loading), the net area may decrease to produce mechanical work. Alternatively, when an electroactive polymer is continuously being cycled between actuator and generator modes, electrical or mechanical (elastic) energy may be stored from one part of the cycle for use in other parts of the cycle. This may further introduce situations in which the net area may decrease to produce mechanical work. Thus, devices of the present invention may include both actuator and generator modes, depending on how the polymer is arranged and applied.

2. General Structure of Electroactive Polymers

The transformation between electrical and mechanical energy in devices of the present invention is based on energy conversion of one or more active areas of an electroactive polymer. Electroactive polymers deflect when actuated by electrical energy. To help illustrate the performance of an electroactive polymer in converting electrical energy to mechanical energy, FIG. 1A illustrates a top perspective view of a transducer portion 100 in accordance with one embodiment of the present invention. The transducer portion 100 comprises an electroactive polymer 102 for converting between electrical energy and mechanical energy. In one embodiment, an electroactive polymer refers to a polymer that acts as an insulating dielectric between two electrodes and may deflect upon application of a voltage difference between the two electrodes. Top and bottom electrodes 104 and 106 are attached to the electroactive polymer 102 on its top and bottom surfaces, respectively, to provide a voltage difference across a portion of the polymer 102. Polymer 102 deflects with a change in electric field provided by the top and bottom electrodes 104 and 106. Deflection of the transducer portion 100 in response to a change in electric field provided by the electrodes 104 and 106 is referred to as actuation. As polymer 102 changes in size, the deflection may be used to produce mechanical work.

Figure 1B:
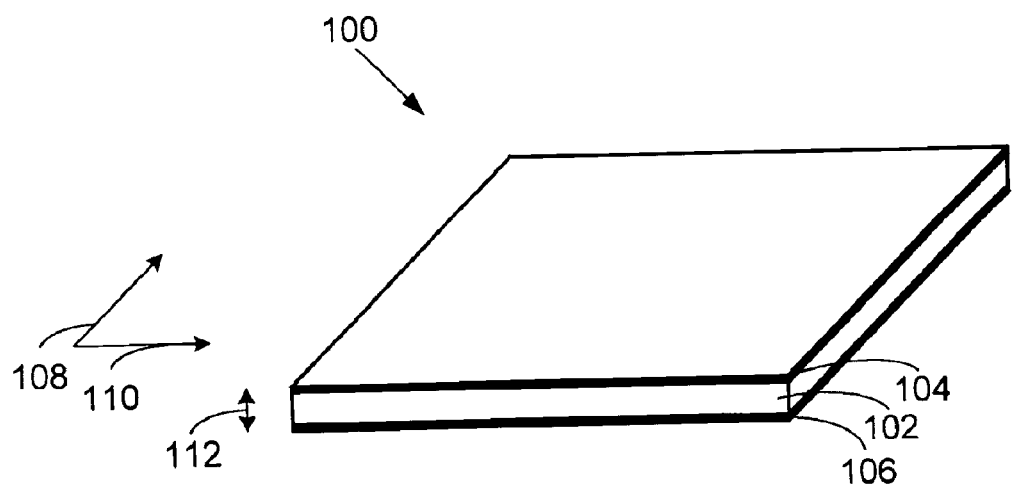

FIG. 1B illustrates a top perspective view of the transducer portion 100 including deflection in response to a change in electric field. In general, deflection refers to any displacement, expansion, contraction, torsion, linear or area strain, or any other deformation of a portion of the polymer 102. The change in electric field corresponding to the voltage difference applied to or by the electrodes 104 and 106 produces mechanical pressure within polymer 102. In this case, the unlike electrical charges produced by electrodes 104 and 106 attract each other and provide a compressive force between electrodes 104 and 106 and an expansion force on polymer 102 in planar directions 108 and 110, causing polymer 102 to compress between electrodes 104 and 106 and stretch in the planar directions 108 and 110.

In some cases, electrodes 104 and 106 cover a limited portion of polymer 102 relative to the total area of the polymer. This may be done to prevent electrical breakdown around the edge of polymer 102 or to achieve customized deflections for one or more portions of the polymer. As the term is used herein, an active area is defined as a portion of a transducer comprising polymer material 102 and at least two electrodes. When the active area is used to convert electrical energy to mechanical energy, the active area includes a portion of polymer 102 having sufficient electrostatic force to enable deflection of the portion. When the active area is used to convert mechanical energy to electrical energy, the active area includes a portion of polymer 102 having sufficient deflection to enable a change in electrostatic energy. As will be described below, a polymer of the present invention may have multiple active areas. In some cases, polymer 102 material outside an active area may act as an external spring force on the active area during deflection. More specifically, polymer material outside the active area may resist active area deflection by its contraction or expansion. Removal of the voltage difference and the induced charge causes the reverse effects.

Electrodes 104 and 106 are compliant and change shape with polymer 102. The configuration of polymer 102 and electrodes 104 and 106 provides for increasing polymer 102 response with deflection. More specifically, as the transducer portion 100 deflects, compression of polymer 102 brings the opposite charges of electrodes 104 and 106 closer and the stretching of polymer 102 separates similar charges in each electrode. In one embodiment, one of the electrodes 104 and 106 is ground.

In general, the transducer portion 100 continues to deflect until mechanical forces balance the electrostatic forces driving the deflection. The mechanical forces include elastic restoring forces of the polymer 102 material, the compliance of electrodes 104 and 106, and any external resistance provided by a device and/or load coupled to the transducer portion 100, etc. The deflection of the transducer portion 100 as a result of the applied voltage may also depend on a number of other factors such as the polymer 102 dielectric constant and the size of polymer 102.

Electroactive polymers in accordance with the present invention are capable of deflection in any direction. After application of the voltage between electrodes 104 and 106, polymer 102 expands (stretches) in both planar directions 108 and 110. In some cases, polymer 102 is incompressible, e.g. has a substantially constant volume under stress. For an incompressible polymer 102, polymer 102 decreases in thickness as a result of the expansion in the planar directions 108 and 110. It should be noted that the present invention is not limited to incompressible polymers and deflection of the polymer 102 may not conform to such a simple relationship.

Application of a relatively large voltage difference between electrodes 104 and 106 on the transducer portion 100 shown in FIG. 1A will cause transducer portion 100 to change to a thinner, larger area shape as shown in FIG. 1B. In this manner, the transducer portion 100 converts electrical energy to mechanical energy. The transducer portion 100 may also be used to convert mechanical energy to electrical energy.

FIGS. 1A and 1B may be used to show one manner in which the transducer portion 100 converts mechanical energy to electrical energy. For example, if the transducer portion 100 is mechanically stretched by external forces to a thinner, larger area shapesuch as that shown in FIG. 1B, and a relatively small voltage difference (less than that necessary to actuate the film to the configuration in FIG. 1B) is applied between electrodes 104 and 106, the transducer portion 100 will contract in area between the electrodes to a shape such as in FIG. 1A when the external forces are removed. Stretching the transducer refers to deflecting the transducer from its original resting position—typically to result in a larger net area between the electrodes, e.g. in the plane defined by directions 108 and 110 between the electrodes. The resting position refers to the position of the transducer portion 100 having no external electrical or mechanical input and may comprise any pre-strain in the polymer. Once the transducer portion 100 is stretched, the relatively small voltage difference is provided such that the resulting electrostatic forces are insufficient to balance the elastic restoring forces of the stretch. When the external forces are removed, the transducer portion 100 therefore contracts, and it becomes thicker and has a smaller planar area in the plane defined by directions 108 and 110 (orthogonal to the thickness between electrodes). When polymer 102 becomes thicker, it separates electrodes 104 and 106 and their corresponding unlike charges, thus raising the electrical energy and voltage of the charge. Further, when electrodes 104 and 106 contract to a smaller area, like charges within each electrode compress, also raising the electrical energy and voltage of the charge. Thus, with different charges on electrodes 104 and 106, contraction from a shape such as that shown in FIG. 1B to one such as that shown in FIG. 1A raises the electrical energy of the charge. That is, mechanical deflection is being turned into electrical energy and the transducer portion 100 is acting as a generator.

In some cases, the transducer portion 100 may be described electrically as a variable capacitor. The capacitance decreases for the shape change going from that shown in FIG. 1B to that shown in FIG. 1A. Typically, the voltage difference between electrodes 104 and 106 will be raised by contraction. This is normally the case, for example, if additional charge is not added or subtracted from electrodes 104 and 106 during the contraction process. The increase in electrical energy, U, may be illustrated by the formula U=0.5 $Q^2/C$, where Q is the amount of positive charge on the positive electrode and C is the variable capacitance which relates to the intrinsic dielectric properties of polymer 102 and its geometry. If Q is fixed and C decreases, then the electrical energy U increases. The increase in electrical energy and voltage can be recovered or used in a suitable device or electronic circuit in electrical communication with electrodes 104 and 106. In addition, the transducer portion 100 may be mechanically coupled to a mechanical input that deflects the polymer and provides mechanical energy.

The transducer portion 100 will convert mechanical energy to electrical energy when it contracts. Some or all of the charge and energy can be removed when the transducer portion 100 is fully contracted in the plane defined by directions 108 and 110. Alternatively, some or all of the charge and energy can be removed during contraction. If the electric field pressure in the polymer increases and reaches balance with the mechanical elastic restoring forces and external load during contraction, the contraction will stop before full contraction, and no further elastic mechanical energy will be converted to electrical energy. Removing some of the charge and stored electrical energy reduces the electrical field pressure, thereby allowing contraction to continue. Thus, removing some of the charge may further convert mechanical energy to electrical energy. The exact electrical behavior of the transducer portion 100 when operating as a generator depends on any electrical and mechanical loading as well as the intrinsic properties of polymer 102 and electrodes 104 and 106.

In one embodiment, electroactive polymer 102 is pre-strained. Pre-strain of a polymer may be described, in one or more directions, as the change in dimension in a direction after pre-straining relative to the dimension in that direction before pre-straining. The pre-strain may comprise elastic deformation of polymer 102 and be formed, for example, by stretching the polymer in tension and fixing one or more of the edges while stretched. For many polymers, pre-strain improves conversion between electrical and mechanical energy. The improved mechanical response enables greater mechanical work for an electroactive polymer, e.g., larger deflections and actuation pressures. In one embodiment, prestrain improves the dielectric strength of the polymer. In another embodiment, the pre-strain is elastic. After actuation, an elastically pre-strained polymer could, in principle, be unfixed and return to its original state. The pre-strain may be imposed at the boundaries using a rigid frame or may also be implemented locally for a portion of the polymer.

In one embodiment, pre-strain is applied uniformly over a portion of polymer 102 to produce an isotropic pre-strained polymer. For example, an acrylic elastomeric polymer may be stretched by 200 to 400 percent in both planar directions. In another embodiment, prestrain is applied unequally in different directions for a portion of polymer 102 to produce an anisotropic pre-strained polymer. In this case, polymer 102 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, more deflection occurs in the low pre-strain direction. In one embodiment, the deflection in direction 108 of transducer portion 100 can be enhanced by exploiting large pre-strain in the perpendicular direction 110. For example, an acrylic elastomeric polymer used as the transducer portion 100 may be stretched by 100 percent in direction 108 and by 500 percent in the perpendicular direction 110. The quantity of pre-strain for a polymer may be based on the polymer material and the desired performance of the polymer in an application. Pre-strain suitable for use with the present invention is further described in commonly owned, copending U.S. patent application Ser. No. 09/619,848, which is incorporated by reference for all purposes.

Generally, after the polymer is pre-strained, it may be fixed to one or more objects. Each object is preferably suitably stiff to maintain the level of pre-strain desired in the polymer. The polymer may be fixed to the one or more objects according to any conventional method known in the art such as a chemical adhesive, an adhesive layer or material, mechanical attachment, etc.

Transducers and pre-strained polymers of the present invention are not limited to any particular geometry or type of deflection. For example, the polymer and electrodes may be formed into any geometry or shape including tubes and rolls, stretched polymers attached between multiple rigid structures, stretched polymers attached across a frame of any geometry—including curved or complex geometries, across a frame having one or more joints, etc. Deflection of a transducer according to the present invention includes linear expansion and compression in one or more directions, bending, axial deflection when the polymer is rolled, deflection out of a hole provided on a substrate, etc. Deflection of a transducer may be affected by how the polymer is constrained by a frame or rigid structures attached to the polymer. In one embodiment, a flexible material that is stiffer in elongation than the polymer is attached to one side of a transducer to induce bending when the polymer is actuated.

Materials suitable for use as a pre-strained polymer with the present invention may include any substantially insulating polymer or rubber (or combination thereof) that deforms in response to an electrostatic force or whose deformation results in a change in electric field. One suitable material is NuSil CF19-2186 as provided by NuSil Technology of Carpenteria, Calif. Other exemplary materials suitable for use as a pre-strained polymer include silicone elastomers, acrylic elastomers such as VHB 4910 acrylic elastomer as produced by 3M Corporation of St. Paul, Minn., polyurethanes, thermoplastic elastomers, copolymers comprising PVDF, pressure-sensitive adhesives, fluoroelastomers, polymers comprising silicone and acrylic moieties, and the like. Polymers comprising silicone and acrylic moieties may include copolymers comprising silicone and acrylic moieties, polymer blends comprising a silicone elastomer and an acrylic elastomer, for example. Combinations of some of these materials may also be used as the electroactive polymer in transducers of this invention.

An electroactive polymer layer in transducers of the present invention may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 50 micrometers.

Suitable actuation voltages for electroactive polymers, or portions thereof, may vary based on the material properties of the electroactive polymer, such as the dielectric constant, as well as the dimensions of the polymer, such as the thickness of the polymer film For example, actuation electric fields used to actuate polymer 102 in FIG. 1A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example.

As electroactive polymers of the present invention may deflect at high strains, electrodes attached to the polymers should also deflect without compromising mechanical or electrical performance. Generally, electrodes suitable for use with the present invention may be of any shape and material provided that they are able to supply a suitable voltage to, or receive a suitable voltage from, an electroactive polymer. The voltage may be either constant or varying over time. In one embodiment, the electrodes adhere to a surface of the polymer. Electrodes adhering to the polymer are preferably compliant and conform to the changing shape of the polymer. Correspondingly, the present invention may include compliant electrodes that conform to the shape of an electroactive polymer to which they are attached. The electrodes may be only applied to a portion of an electroactive polymer and define an active area according to their geometry. Several examples of electrodes that only cover a portion of an electroactive polymer will be described in further detail below.

Various types of electrodes suitable for use with the present invention are described in commonly owned, copending U.S. patent application Ser. No. 09/619,848, which was previously incorporated by reference above. Electrodes described therein and suitable for use with the present invention include structured electrodes comprising metal traces and charge distribution layers, textured electrodes comprising varying out of plane dimensions, conductive greases such as carbon greases or silver greases, colloidal suspensions, high aspect ratio conductive materials such as carbon fibrils and carbon nanotubes, and mixtures of ionically conductive materials.

Materials used for electrodes of the present invention may vary. Suitable materials used in an electrode may include graphite, carbon black, colloidal suspensions, thin metals including silver and gold, silver filled and carbon filled gels and polymers, and ionically or electrically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. For example, carbon fibrils work well with acrylic elastomer polymers while not as well with silicone polymers. For most transducers, desirable properties for the compliant electrode may include one or more of the following: low modulus of elasticity, low mechanical damping, low surface resistivity, uniform resistivity, chemical and environmental stability, chemical compatibility with the electroactive polymer, good adherence to the electroactive polymer, and the ability to form smooth surfaces. In some cases, a transducer of the present invention may implement two different types of electrodes, e.g. a different electrode type for each active area or different electrode types on opposing sides of a polymer.

Electronic drivers are typically connected to the electrodes. The voltage provided to electroactive polymer will depend upon specifics of an application. In one embodiment, a transducer of the present invention is driven electrically by modulating an applied voltage about a DC bias voltage. Modulation about a bias voltage allows for improved sensitivity and linearity of the transducer to the applied voltage. For example, a transducer used in an audio application may be driven by a signal of up to 200 to 1000 volts peak to peak on top of a bias voltage ranging from about 750 to 2000 volts DC.

3. Multiple Active Areas

In accordance with the present invention, the term "monolithic" is used herein to refer to electroactive polymers, transducers, and devices comprising a plurality of active areas.

Figure 1C:
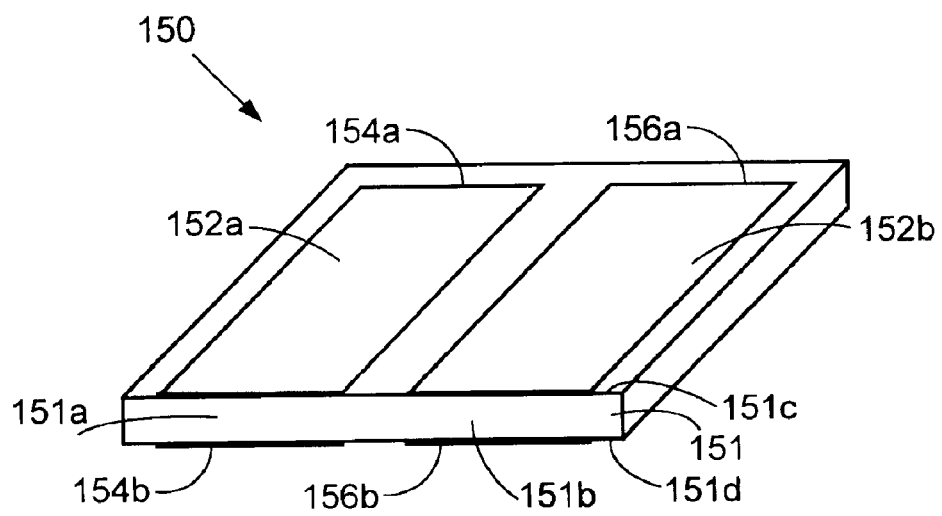
FIG. 1C illustrates a transducer comprising a plurality of active areas in accordance with one embodiment of the present invention.

FIG. 1C illustrates a monolithic transducer 150 comprising a plurality of active areas in accordance with one embodiment of the present invention. The monolithic transducer 150 converts between electrical energy and mechanical energy. The monolithic transducer 150 comprises an electroactive polymer 151 including two active areas 152a and 152b. The polymer 151 can be held using, for example, a rigid frame (not shown) attached at the edges of the polymer 151.

The active area 152a has top and bottom electrodes 154a and 154b attached to the polymer 151 on its top and bottom surfaces 151c and 151d, respectively. The electrodes 154a and 154b provide a voltage difference across a portion 151a of the polymer 151. The portion 151a deflects with a change in electric field provided by the electrodes 154a and 154b. The portion 151a comprises the polymer 151 between the electrodes 154a and 154b and any other portions of the polymer 151 having sufficient electrostatic force to enable deflection upon application of voltages using the electrodes 154a and 154b. When the device 150 is used as a generator to convert from electrical energy to mechanical energy, deflection of the portion 151a causes a change in electric field in the portion 151a that is received as a change in voltage difference by the electrodes 154a and 154b.

The active area 152b has top and bottom electrodes 156a and 156b attached to the polymer 151 on its top and bottom surfaces 151c and 151d, respectively. The electrodes 156a and 156b provide a voltage difference across a portion 151b of the polymer 151. The portion 151b deflects with a change in electric field provided by the electrodes 156a and 156b. The portion 151b comprises the polymer 151 between the electrodes 156a and 156b and any other portions of the polymer 151 having sufficient stress induced by the electrostatic force to enable deflection upon application of voltages using the electrodes 156a and 156b. When the device 150 is used as a generator to convert from electrical energy to mechanical energy, deflection of the portion 151b causes a change in electric field in the portion 151b that is received as a change in voltage difference by the electrodes 156a and 156b.

The active areas for monolithic polymers and transducers of the present invention may be flexibly arranged. In one embodiment, active areas in a polymer are arranged such that elasticity of the active areas is balanced. In another embodiment, a transducer of the present invention includes a plurality of symmetrically arranged active areas.

Figure 1D:
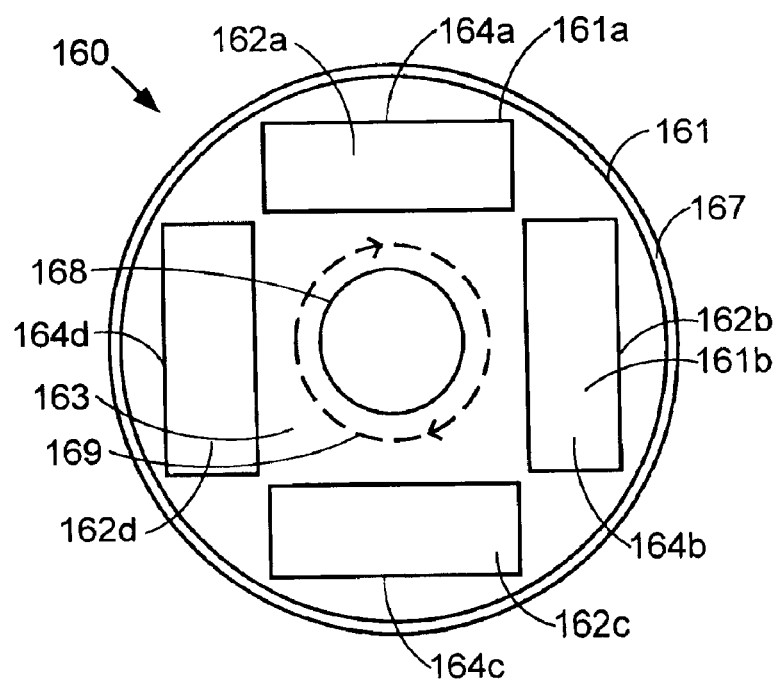
FIG. 1D illustrates a device comprising a plurality of symmetrically arranged electrodes in accordance with a specific embodiment of the present invention.

FIG. 1D illustrates a device 160 comprising a plurality of symmetrically arranged active areas in accordance with a specific embodiment of the present invention. The device 160 includes a monolithic transducer comprising four active areas 162a–d. Each of the active areas 162a–d includes top and bottom electrodes 164a–d attached to a polymer 161 on its top and bottom surfaces respectively (only the electrodes 164a–d on the facing surface of the polymer 161 are illustrated). The electrodes 164a–d each provide a voltage difference across a portion of the polymer 161. The electrodes 164a–d and their corresponding active areas 162a–d are symmetrically and radially arranged around a center point of the circular polymer 161. Correspondingly, the elasticity of the active areas 162a–d is balanced.

A first active area 162a is formed with the two first active area electrodes 164a and a first portion of the electroactive polymer 161a. The portion 161a is arranged in a manner which causes the first portion 161a to deflect in response to a change in electric field provided by the first active area electrodes 164a. The portion 161a includes the polymer 161 between the electrodes 162a and any other portions of the polymer 161 having sufficient stresses induced by the electrostatic force to enable deflection upon application of voltages using the electrodes 162a. Similarly, a second active area 162c is formed with the two second active area electrodes 164c and a second portion of the electroactive polymer 161c. The portion 161c is arranged in a manner which causes the second portion 161c to deflect in response to a change in electric field provided by the at least two second active area electrodes 164c. A similar arrangement applies to the active areas 162b and 162d.

A substantially rigid frame 167 is fixed to the perimeter of the circular polymer 161 such as by using an adhesive. A substantially rigid member 168 is attached to a central portion 163 of the polymer 161 and allows mechanical output for the device 160. The member 168 provides mechanical output for the device 160 based on deflection of the central portion 163 relative to the rigid frame 167. The central portion 163 is located at least partially between the active area 162a and the active area 162c and at least partially between the active area 162b and the active area 162d. Although the central portion 163 is illustrated as a centrally located circle, it should be understood that the central portion 163 may be any portion of the polymer 161 between the active areas 162a–d. Thus, the substantially rigid member 168 may be attached to the polymer 161 in any part of the polymer 161 between the active areas 162a–d and transfer deflection of that portion as mechanical output of the device 160.

Actuation of the active area 162a moves the central portion 163 down. Actuation of the active area 162b moves the central portion 163 to the left. Actuation of the active area 162c moves the central portion 163 up. Actuation of the active area 162d moves the central portion 163 to the right. When electrical energy is removed from the electrodes 164a, the central portion 163 elastically returns up to its position before actuation of the active area 162a. A similar elastic return occurs for the other active areas 164b–d.

The active areas 162 are arranged relative to each other such that elastic energy of one active area facilitates deflection of another. The active area 162a is arranged relative to the active areas 162c such that elastic energy of the active area 162a may facilitate deflection of the active area 162c. In this case, contraction of the active area 162a at least partially facilitates expansion of the active area 162c, and vice versa. More specifically, deflection of the active area 162a includes a direction of contraction that is at least partially linearly aligned with a direction of expansion for the active area 162c towards the active area 162a. In another embodiment, the active areas 162a–d are not grouped into pairs. In order for the elastic energy of one active area to facilitate the deflection of another active area, it may only be necessary for the active areas share motion in a common linear direction. In this way the polymer of transducer 160 could have two, three, five or any number of active areas arranged such that the motion of one active area shares a direction with that of another area.

The present invention also includes methods for deflecting one or more electroactive polymers having a plurality of active areas. These comprise include deflection as a result of electrical energy input (actuation) to the polymer and electrical energy output from the polymer (generation). Methods for actuating a transducer or device according to one embodiment of the present invention generally comprise deflecting the first portion such that elastic potential energy of the at least one electroactive polymer is substantially constant for the deflection.

For example, the active areas 162a–d may be actuated sequentially to move the central portion 163 along a circular path 169. As will be described in further detail below, elastic potential energy for the device 160 is substantially constant along the path 169. To achieve the circular path 169, the active areas 162a–d are actuated sequentially in clockwise order and in a timely manner. More specifically, electrical energy is supplied to the electrodes 164b while the active area 162a contracts as electrical energy is removed from it. Electrical energy is supplied to the electrodes 164c while the active area 162b contracts. A similar timing is applied in actuating the other active areas to produce the circular path 169. This sequential clockwise actuation may be repeatedly performed to continuously move the central portion 163 in the circular path 169. Continuous circular output of the central portion 163 may be used to drive a motor. In a specific embodiment, the member 168 may be used as a crank in a rotary crank motor.

The monolithic transducers 150 and 160 illustrated and described herein include active areas with similar geometries and symmetrical configurations. It is understood that monolithic polymers of the present invention may include one or more active areas each having a non-symmetrical and custom geometry. It is also understood that active areas on a monolithic polymer may be combined in any configuration. These custom geometry active areas and configurations may be used to produce any custom two-dimensional path or output for a portion of a polymer. For example, the two-dimensional path illustrated above may be achieved with only two active areas without the use of expanding and relaxing pairs as described above. In this case, actuation of one active area and its corresponding elastic return may be used to provide controlled deflection along one linear dimension. Actuation of the other active area and its corresponding elastic return may be used to provide controlled deflection at least partially in an orthogonal linear dimension.

4. Actuator and Generator Devices

The deflection of an electroactive polymer can be used in a variety of ways to produce or receive mechanical energy. Generally, electroactive polymers of the present invention may be implemented with a variety of devices—including conventional actuators and generators retrofitted with an electroactive polymer and custom actuators and generators specially designed for one or more electroactive polymers. Conventional actuators and generators include extenders, bending beams, stacks, diaphragms, etc. Several exemplary devices suitable for use with the present invention will now be discussed. Additional actuators suitable for use with the present invention are described in commonly owned, copending U.S. patent application Ser. No. 09/619,848, which was previously incorporated by reference.

Figure 2A:
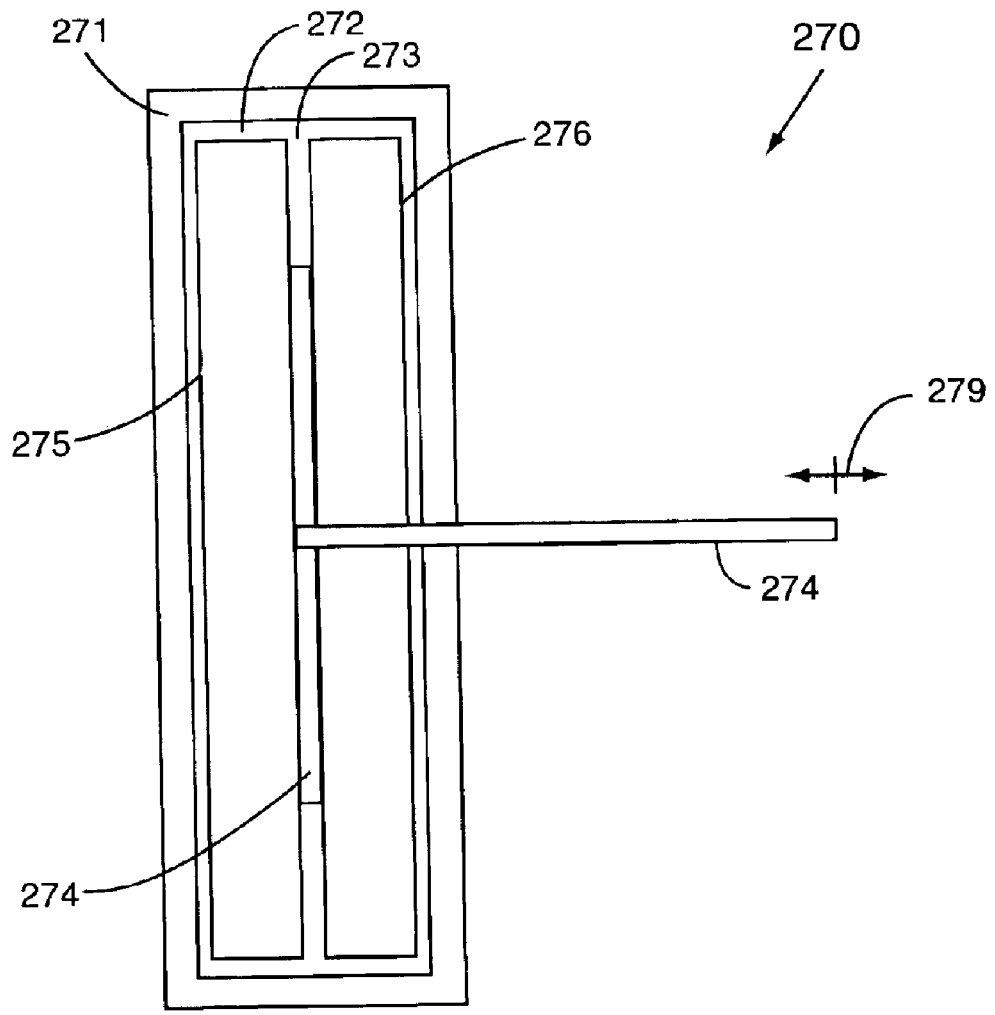
FIG. 2A illustrates a stretched film device in accordance with one embodiment of the present invention.

FIG. 2A illustrates a stretched film device 270 in accordance with one embodiment of the present invention. The stretched film device 270 includes a rigid frame 271 having a hole 272. An electroactive polymer 273 is attached in tension to the frame 271 and spans the hole 272. A rigid bar 274 is attached to the center of the polymer 273 and provides mechanical output corresponding to deflection of the polymer 273. The rigid bar 274 can be different lengths depending on the size of the polymer 273 and the amount of force or motion 279 desired. In one embodiment, the rigid bar 274 is about 75% of the length of the hole 272 along the direction of the central attachment (perpendicular to stroke 279).

Compliant electrode pairs 275 and 276 are patterned on both opposing surfaces of the polymer 273 and on the left and right sides respectively of the rigid bar 274. When the electrode pair 275 is actuated, a portion of the polymer 273 between, and in the vicinity of, the electrode pair 275 expands relative to the rest of the polymer 273 to move the rigid bar 274 to the right. Conversely, when the electrode pair 276 is actuated, a second portion of the polymer 273 affected by the electrode pair 276 expands relative to the rest of the polymer 273 and allows the rigid bar 274 to move to the left. Alternating actuation of the electrodes 275 and 276 provides a total stroke 279 for the rigid bar 274.

One variation of the stretched film device 270 includes adding an anisotropic pre-strain to the polymer such that the polymer has high pre-strain (and stiffness) in the direction perpendicular to the rigid bar displacement or a lower prestrain and stiffness in the direction of 279. This increases the stroke 279. Another variation is to eliminate one of the electrode pairs. For the benefit of simplifying the design, this variation reduces the stroke 279 for the stretched film device 270. In this case, the portion of the polymer no longer used by the removed electrode now responds passively like a restoring spring.

Figure 2B:
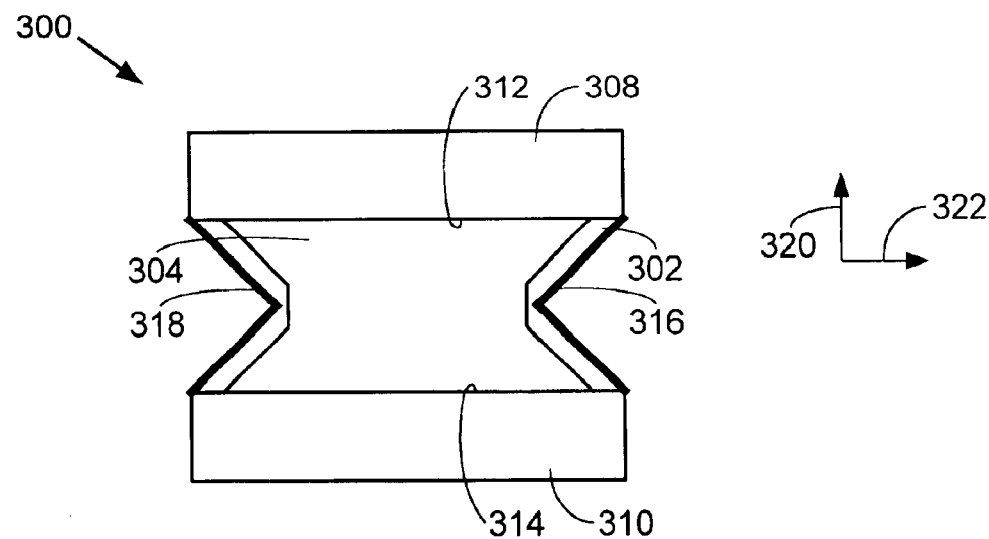
FIGS. 2B and 2C illustrate a device for converting between electrical energy and mechanical energy in accordance with another embodiment of the present invention.
Figure 2C:
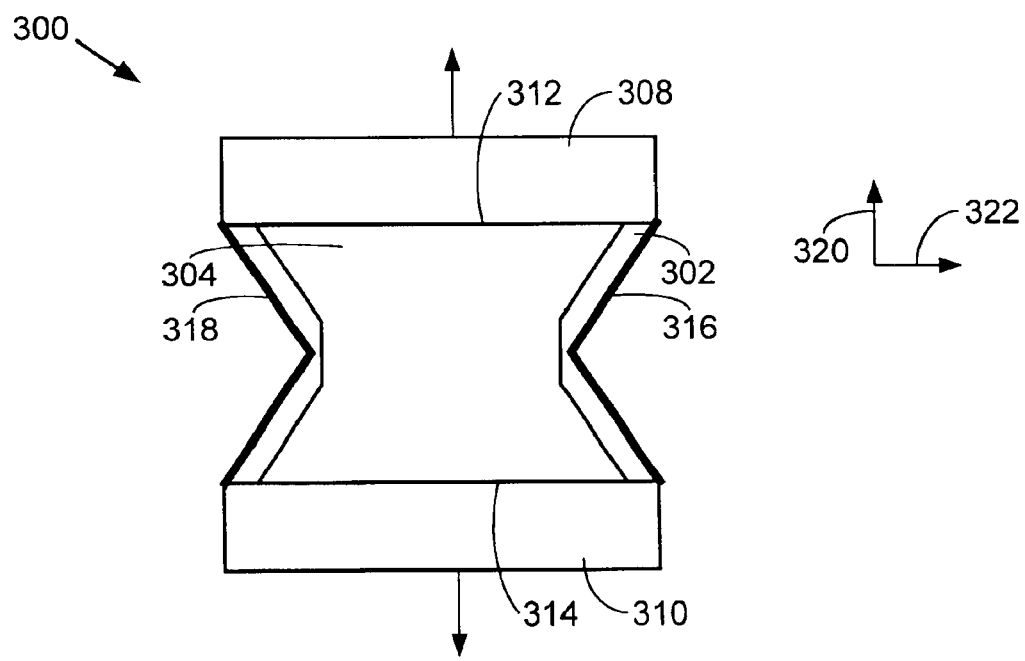

FIGS. 2B and 2C illustrate a device 300 suitable for use with the present invention. The device 300 includes a polymer 302 arranged in a manner which causes a portion of the polymer to deflect in response to a change in electric field. Electrodes 304 are attached to opposite surfaces of the polymer 302 and cover a substantial portion of the polymer 302 (only the foremost electrode 304 is illustrated). Two stiff members 308 and 310 extend along opposite edges 312 and 314 of the polymer 302. Flexures 316 and 318 are situated along the remaining edges of the polymer 302. Each flexure 316 and 318 comprises two rigid elements that meet at a joint. The distal ends of each rigid element are attached to the stiff members 308 and 310. The flexures 316 and 318 improve conversion between electrical energy and mechanical energy for the device 300.

The flexures 316 and 318 couple polymer 302 deflection in one direction into deflection in another direction. In one embodiment, each of the two rigid elements rest at an angle about 90 degrees in the plane of the polymer 302. Upon actuation of the polymer 302, expansion of the polymer 302 in the direction 320 causes the stiff members 308 and 310 to move apart, as shown in FIG. 2C. In addition, expansion of the polymer 302 in the direction 322 causes the flexures 316 and 318 to straighten, and further separates the stiff members 308 and 310. In this manner, the device 300 couples expansion of the polymer 302 in both planar directions 320 and 322 into mechanical output in the direction 320.

One advantage of the device 300 is that the entire structure is planar. This allows for easy mechanical coupling and simple expansion. For example, the stiff members 308 and 310 may be mechanically coupled (e.g. glued or similarly fixed) to their respective counterparts of a second device 300 to provide two devices 300 in parallel in order to increase the force output over single device 300. Alternatively, the stiff member 308 from one device may be attached to the stiff member 310 from a second device in order to provide multiple devices in series that increase the deflection output over a single device 300.

5. Energy Features

Electroactive polymer material provides a spring force during deflection. Typically, polymer material resists deflection during actuation by its contraction (polymer material outside of an active area) or its expansion (polymer material included in an active area). Removal of the actuation voltage and the induced charge causes the reverse effects. The effects of electroactive polymer elasticity are also witnessed when the polymer is used to convert mechanical energy to electrical energy. In general, when actuation voltages and any external loads are removed, electroactive polymers, or portions thereof, elastically return to their resting position. In one aspect of the present invention, elastic properties of one or more portions of an electroactive polymer, and any energy contribution of external loads, are used to assist electroactive polymer deflection.

In one embodiment, a polymer of the present invention is arranged such that deflection of a portion of the polymer in response to a change in electric field is at least partially assisted by mechanical input energy. As the term is used herein, mechanical input energy refers to mechanical energy that contributes to deflection of a portion of an electroactive polymer. The mechanical input energy provided to a portion of an electroactive polymer may include elastic energy provided by another portion of the electroactive polymer, a portion of another electroactive polymer, a spring, etc. The mechanical input energy may also include energy provided an external load or mechanism coupled to the electroactive polymer. For example, when the device 160 of FIG. 1D is used in a crank motor and the rigid member 168 is a crank arm in the crank motor, a flywheel may be coupled to the rigid member 168 to assist deflection of one of the active areas 162a–d in deflecting the rigid member 168 along the circular path 169.

Cumulatively, the sum of elastic energy in a transducer or device may be referred to as the elastic potential energy of the transducer or device. Elastic potential energy may be used to describe transducers and devices of the present invention and methods of deflecting these transducers and devices. In one embodiment, an electroactive polymer is arranged such that deflection of the electroactive polymer is substantially independent of elastic potential energy. In this case, changes in elastic energy of one or more portions of an electroactive polymer are balanced by the changes in elastic energy in the remainder of the transducer or device. The deflection may be in response to a change in electric field in the polymer and/or deflection of a portion that causes a change in electric field. Since the deflection does not cause a substantial change in the net elastic potential energy of the device, the deflection can be made with very little input energy and force, even though the individual elastic forces internal to the device might be quite large.

Figure 3A:
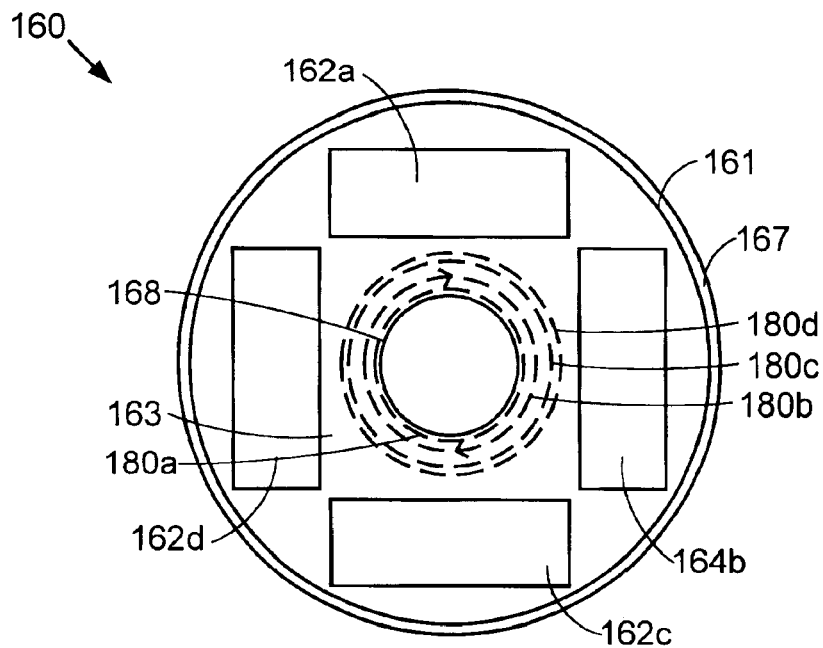
FIG. 3A demonstrates mechanical input energy and substantially constant elastic energy features using the device of FIG. 1D in accordance with one embodiment of the present invention.

FIG. 3A demonstrates mechanical input energy and substantially constant elastic energy deflection using the device 160 of FIG. 1D in accordance with one embodiment of the present invention. The device 160 includes four substantially equipotential lines 180a–d. The equipotential line 180a corresponds to the circular path 169 of FIG. 1D. The active areas 162a–d are able to move the central portion 163 along any one of the equipotential lines 180a–d. When the active areas 162 move the central portion 163 along any one of the equipotential lines 180a–d, elastic potential energy of the device 160 is substantially independent of the position of the central portion 163 on the line. In other words, the elastic potential energy of the device 160 remains substantially constant as the central portion 163 moves along any one of the equipotential lines 180a–d.

As a result of this elastic energy balance, electrical input used for actuation of the device 160 does not need to overcome elastic energy of the polymer 161 as the central portion 163 moves along any one of the equipotential lines 180a–d. Actuating the device 160 in this manner results in an increased mechanical output for a given electrical input compared to actuation of the device 160 when not using one of the equipotential lines 180a–d. The increased mechanical output may be used to increase deflection of the portion 163.

In one embodiment, a substantially loss-less motion constraint or mechanism, such as a crank or a roller on a round surface, constrains the deflection of the device 160 and holds the rigid member 168 along a given equipotential line 180a–d. The rigid motion constraint or mechanism provides the necessary forces perpendicular to a given equipotential line 180a–d at any given point to offset the elastic forces in that direction. In another embodiment, actuation may occur without a motion constraint device or constraint forces along a constant energy path. In this case, the device 160 may need to supply energy to keep on a given equipotential line 180a–d and may reduce efficacy along one of the equipotential lines 180a–d.

Deflection of the device 160 includes mechanical input energy from different portions of the polymer 161. The mechanical input energy includes elastic energy contributions provided by contractions and expansions of each of the active areas 162 and portions of the polymer 161 outside the active areas 162. A motion constraint such as a crank does not provide any mechanical input energy by themselves, but it provides mechanical forces perpendicular to motion on an equipotential line to assist the actuation by holding the motion to a path of constant elastic energy, and thereby eliminate the need for the expansion and contraction of the polymer to provide these forces. The amount of mechanical input energy and timing of actuation may vary. In one embodiment, the total mechanical input energy provided by different portions of the polymer 161 is substantially equal to the elastic energy required to deflect the first active area 162a for a part of the deflection. In another embodiment, the total mechanical input energy provided by different portions of the polymer 161 is substantially equal to the elastic energy required to deflect the first active area 162a for an entire deflection corresponding to an actuation of one of the active areas 162.

For deflection along any one of the equipotential lines 180a–d, the total elastic energy for stretching portions of the polymer 161 during actuation of one or more of the active areas 162a–d is substantially equal to the total elastic energy of contracting portions of the polymer 161. With the elastic energy balanced between the different portions of the polymer 161 along any one of the equipotential lines 180a–d, the mechanical output energy for the device 160 is greater for a given input voltage compared to an arrangement where the elastic energy is not balanced and deflection crosses two or more equipotential lines 180a–d. In other words, deflection that crosses equipotential lines restricts the deflection due to imbalanced elastic forces. In contrast, deflection along one of the equipotential lines 180a–d increases deflection and mechanical output energy for a given input voltage.

The rigid member 168 provides mechanical output for the device 160. To increase mechanical output using of the device 160, the input energy methods of FIG. 3A may be applied to the rigid member 168. More specifically, the rigid member 168 may include a direction of output motion that is at least partially along one of the equipotential lines 180a–d. In addition, an external load (e.g., the flywheel described above) coupled to the rigid member 168 may also assist the rigid member in following one of the equipotential lines 180a–d. For example, rigid member 168 may be constrained to follow an equipotential line 180a–d by attaching it to a crank which constrains the motion of rigid member 168 to a circular path that corresponds to one of the equipotential lines 180a–d.

An active area may include multiple directions of contraction and expansion. Correspondingly, elastic energy generated during actuation of one active area may used to facilitate deflection of more than one other active area. For the device 160, the active areas 162 are arranged relative to each other such that elastic return of one active area 162a–d may facilitate deflection of more than one other active area 162a–d in a direction of actuation. More specifically, the active areas 162a and 162c are arranged such that contraction of the active area 162a may facilitate expansion of the active area 162c in a direction towards the active area 162a. In addition, the active areas 162a and 162b are arranged such that contraction of the active area 162a may facilitate expansion of the active area 162b in a direction towards the active area 162a.

The timing of deflection between active areas may affect elastic energy transfer therebetween. To increase elastic energy transfer for the transducer 160, the active areas 161a–d may be actuated at a high enough rate such that elastic return of one active area assists the deflection of more than one active area subsequently actuated. This may be useful for active areas having more than one direction of actuation. For example, to increase elastic energy transfer to the active areas 162b and 161c, actuation of active areas 162b and 161c may begin actuation during elastic return of active area 161a. In this manner, elastic energy generated during actuation of active area 162a is transferred to two active areas 162b and 162c actuated thereafter. A similar timing may be continuously applied as the active areas 162a–d are actuated in turn.

For the device 160, there is a complementary nature of the active areas 162a–d on opposite sides of the rigid member 168. It should be noted that active areas for a device need not be grouped in complementary pairs as described with the device 160. For example, an odd number of active areas arranged around the rigid member 168 may still employ the elastic energy balance and mechanical input energy features described above. More specifically, three active areas arranged around the rigid member 168 at 120 degree intervals may still employ the elastic energy balance and mechanical input energy features described above. In this case, the expansion of one active area is paired with the contraction of more than one other active area.

The active areas for a polymer may be arranged in different ways depending on an application. As mentioned before, it is understood that a monolithic polymer of the present invention may include one or more custom geometry active areas. The arrangement and number of these custom geometry active areas may affect elastic energy transfer and the shape of any equipotential lines.

Any electroactive polymer device with more than one active area, element, or passive element that balances the elastic energy of the active element will have one or more equipotential lines. As one of skill in the art will appreciate, a device may include an infinite number of equipotential line separated by small increments. In many cases, the equipotential lines will not correspond to a simple geometric path as described above and may have complex shapes. Equipotential lines for a transducer or device may be estimated by making physical assumptions about the transducers. For example, the transducers may be assumed to behave elastically like springs based on known elastic moduli of a polymer and the polymer geometry. Alternatively, equipotential lines for a polymer or device may be estimated by directly measuring the mechanical energy needed to deflect the polymer or device. For example, the elastic energy behavior of an individual transducer during stretching and contracting may be measured to produce an energy-displacement curve. The energy-displacement curve may then be used to estimate equipotential paths of a collection of identical transducers that are similarly configured.

Generally, the elastic energy features of the present invention are applicable to any combination of active areas, polymers, transducers and/or devices, such that the total elastic potential energy of the device is substantially independent of deflection. For example, the elastic energy methods of the present invention apply to a plurality of active areas on different polymers and devices. In one embodiment, a device of the present invention comprises a first electroactive polymer including the first active area and a second electroactive polymer including the second active area.

In another embodiment, electroactive polymers in a device are arranged such that elasticity of the polymers is balanced. Further, the active areas on the multiple polymers may be arranged such that their areas are elastically balanced. In yet another embodiment, a plurality of active areas are symmetrically arranged on multiple polymers of a device. Advantageously, transferring elastic energy between polymers may eliminate the need for electroactive forces generated by electrodes to overcome some of the elastic resistance of one of the polymers. In one embodiment, the mechanical input energy provided to a portion of a polymer is less than the elastic energy required to deflect the first portion of the electroactive polymer for a part of the deflection. In some cases, elastic energy may be transferred between polymers without external assistance. In other cases, one or more external mechanisms may be used to transfer elastic energy of one polymer to another. The mechanisms may include cables, belts, pulleys, levers, etc.

Figure 3B:
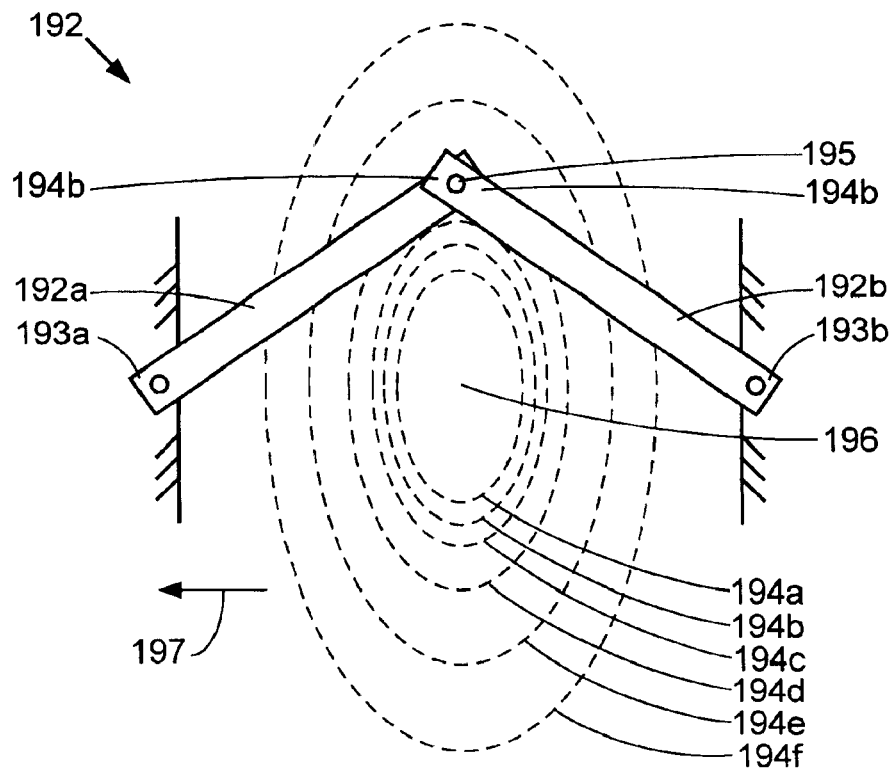
FIG. 3B illustrates a device comprising two transducers in accordance with one embodiment of the present invention.

FIG. 3B illustrates a device 191 comprising two transducers 192a and 192b in accordance with one embodiment of the present invention. The transducers 192a and 192b are each rotatably pinned at their proximate ends 193a and 193b, respectively. The transducers 192a and 192b are also rotatably pinned at their distal ends 194a and 194b, respectively, using a pinned connection 195.

The transducers 192a and 192b are able to move the pinned connection 195 along any one of a set of equipotential lines 194a–f. Motion along one of the equipotential lines 194a–f uses a suitable motion constraint such as an ellipse-shaped surface with a roller connected to pin 195. The motion constraint constrains the pin 195 to move along one of the equipotential lines 194a–f. When the transducers 192 move the connection 195 along one of the equipotential lines 194a–f, elastic potential energy of the device 191 is substantially independent of the position of the connection 195. In other words, the elastic potential energy of the device 191 remains substantially constant as the connection 195 moves along any one of the equipotential lines 194a–f. In this case, elastic potential energy of the lines 194a–f increases with distance away from geometrically central point 196. The central point 196 lies at the half point of the linear distance between the pinned proximate ends. During operation in which the actuator output operates along an equipotential line, the motion constraint, point 196 will not usually be reached.

The transducers 192a and 192b are arranged relative to each other such that elastic energy of one transducer assists deflection of the other. In this case, contraction of the transducer 192a may assist expansion of the transducer 192b, and vice versa. More specifically, deflection of the transducer 192a includes a direction of contraction 197 that is at least partially linearly aligned with a direction of expansion for the transducer 192b. The input energy transferred from the transducer 192a to the transducer 192b is generated in the transducer 192a during actuation of the transducer 192a. By transferring elastic energy in this manner, elastic potential energy from a first polymer may be used to at least partially overcome elastic strain work required in actuating a second polymer.

As a result of the energy transfer between the transducers 192a and 192b, the amount of electrical energy required to continually actuate the transducers 192 to move the connection 195 along one of the equipotential lines 194a–f with a motion constraint is reduced. This reduction in energy may lead to less electrical energy supplied to electrodes in communication with the transducers 192. In other words, the input electrical energy to the transducers 192 will be equal to the amount of energy required to deflect the connection 195 along one of the equipotential lines 194a–f over and above the amount of elastic energy saved by deflecting the connection 195 along one of the equipotential lines 194a–f. Collectively, the total amount of input electrical energy required for continuous actuation of the transducers 192 is reduced by the continuous elastic energy transferred between transducers 192 as the connection 195 follows one of the equipotential lines 194a–f. Advantageously, when devices of the present invention are arranged and actuated in this manner, the reduced amount of electrical energy required for actuation may result in improved electrical to mechanical efficiency. Alternatively, the same amount of input electrical energy may result in an increased mechanical output.

Inherently, any electroactive polymer device may include one or more equipotential lines. To help fit an equipotential line to a desired deflection, external loads having known elasticities may be used to manipulate the elastic energy of a device. For example, a rubber band or spring may be coupled to a polymer to change the elastic energy for deflection in a specific direction. In another embodiment, devices of the present invention may include members or structures that facilitate independent elastic potential energy deflection. For example, the connection 195 in FIG. 3B may be attached to a cam system including a roller or wheel that is constrained to move on a solid surface in the shape of one of the equipotential lines 194a–f.

Figure 3C:
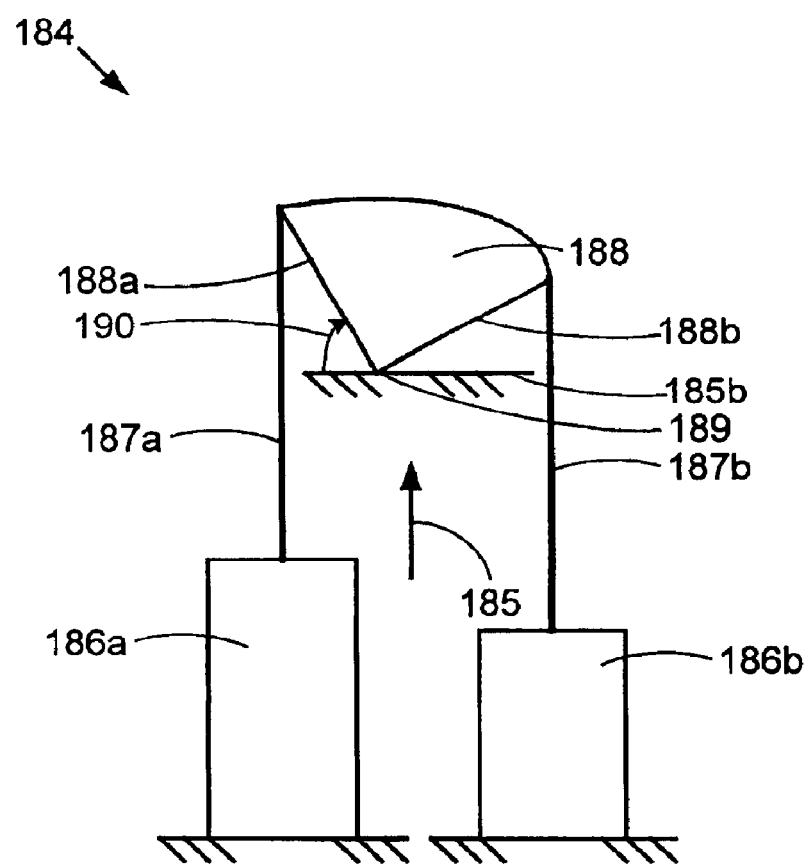
FIG. 3C illustrates a device comprising a member that facilitates deflection substantially independent of elastic potential energy in accordance with a specific embodiment of the present invention.

FIG. 3C illustrates a device 184 comprising a member that facilitates substantially independent elastic potential energy deflection in accordance with a specific embodiment of the present invention. The device 184 includes two linear output transducers 186a and 186b. The linear output transducers 186a and 186b produce deflection in a vertical direction 185a. In one embodiment, the transducers 186a and 186b are each included in an actuator that facilitates linear deflection in the vertical direction 185a, e.g., the device 300 of FIG. 2B. The transducers 186a and 186b are made from the same material and provide a substantially similar spring force for a given deflection in the vertical direction 185a.

Each of the transducers 186a and 186b is mechanically coupled to a lever 188 using cables 187a and 187b, respectively. The lever 188 rotates around a pivot point 189. The lever 188 includes sides 188a and 188b having substantially the same length and extending from a right angle included in the lever 188 at the pivot point 189. For purposes of illustration, an angle 190 is defined between either of the sides 188a and 188b and a line 185b perpendicular to the vertical direction 185a and located at the pivot point 189. When the length of the cables is large compared to the displacement of the transducers 186a and 186b, and transducers 186a and 186b are initially attached with zero deflection when angle 190 is 0 and 90 degrees, respectively, the elastic potential energy of the device 184 is substantially independent of lever 188 deflection about the pivot point 189.

For elastic deflection of most polymers, a larger deflection presents an increase in force and elastic energy. The lever 188 facilitates substantially independent elastic potential energy deflection for the device 184. The lever 188 does so by producing a total potential energy for the device 184 that is substantially constant, regardless of deflection about the pivot point 189 and deflection for the transducers 186a and 186b. The total potential energy for the device 184 may be calculated from the geometry of the lever 188 (based on the length of the sides 188a and 188b, deflection relative to the line 185b and deflection of each of the transducers 186a and 186b). When the polymers act elastically for the displacements of interest, the total potential energy does not substantially change for any angle 190 and deflection of the transducers 186a and 186b. Thus, the lever 188 allows differences in deflection of the transducers 186a and 186b, and differences in forces and elastic energy resulting therefrom, to produce a substantially constant total potential energy for the device 184.

In many cases, it is desirable for an electroactive polymer device return to a specific or "home" position when it is turned off. The home position has a lower elastic potential energy than the substantially constant elastic potential energy of the device 184 during deflection. In one embodiment, the home position is acheived by designing the device 184 such that it does not follow an equipotential path precisely, but rather so that it has a minimum elastic energy at one point (the home position) and elastic energy of the device decreases in the direction from any point to the home position. Thus, when electrical energy is removed from the device, it deterministically returns to the home position via decreasing elastic energy. The restoring force driving the device toward the home position may be increased by increasing the deviation from the equipotential path or configuration.

Using the device 184 of FIG. 3C as an example, the device 184 is substantially equipotential with the transducers 186a and 186b relatively far away from the pivot point 189 and the sides 188a and 188b being at a right angle to each other. If the angle included in the lever 188 between sides 188a and 188b is increased beyond 90 degrees for one of the transducers 186a and 186b, the lever 188 surface is not equipotential and the lowest energy state occurs when the transducers 186a and 186b are of equal length (when cables 187a and 187b are of equal length). In this case, when the voltage applied to the transducers 186a and 186b is set to zero, the device 184 will automatically return to the configuration where the transducers 186a and 186b have equal length—assuming there is no applied external forces or torques on the lever 188. The force or torque driving the device 184 to the home position may be increased by increasing the lever angle further beyond 90 degrees. This however, may reduce the ability to move on an equipotential path.

In one embodiment, actuation of a second active area begins when a first active area is at peak deflection. In another embodiment, actuation of a second active area begins after application of a voltage difference to the at least two first active area electrodes ends. In yet another embodiment, an active area is actuated in resonant mode. Operating an electroactive polymer at resonance using materials, such as silicone, with low losses (e.g., low viscoelastic losses) allows energy available from the elastic return to stay in the polymer in the form of resonant mode vibration or kinetic energy for use in a subsequent actuation.

Although the elastic energy features of the present invention have been discussed with respect to transducers comprising multiple active areas and devices comprising multiple transducers, some of the elastic energy features of the present invention also apply to devices and transducers comprising a single active area. For example, resonant mode actuation also works well with transducers and devices that include a single active area on a single polymer. In this case, energy available from the elastic return of the active area may stay in the polymer in the form of resonant mode vibration and used by the same active area.

6. Applications

The devices and methods of the present invention finds use in a broad range of applications where conversion between electrical and mechanical energy is required. These applications include a wide variety of actuators, motors, generators, sensors, robotics, toys, micro-actuator applications and pumps. Transducers of the present invention may be implemented in both the micro and macro scales—thus increasing the range of application. Provided below are several exemplary applications for some of the transducers and devices described above. The exemplary applications described herein are not intended to limit the scope of the present invention. As one skilled in the art will appreciate, the transducers of the present invention may find use in any application requiring conversion between electrical and mechanical energy.

By repeatedly actuating an electroactive polymer, continuous deflection of the polymer may produce reciprocating linear motion or continuous rotary motion. Reciprocating linear motion may be converted to continuous rotary motion using clutches, gears and the like. Continuous rotary motion generated by an electroactive polymer may be used to drive a motor. Combining different ways to configure one or more electroactive polymers within a motor, different motor designs, scalability of electroactive polymers to both micro and macro levels, and different polymer orientations (e.g., rolling or stacking individual polymer layers) permits a broad range of motor designs comprising one or more electroactive polymers as described herein. These motors convert electrical energy into mechanical work and find use in a wide range of applications. As one of skill in the art will appreciate, there are numerous applications for motors. Due to the weight savings gained by using electroactive polymers in producing mechanical energy for a motor, a motor comprising an electroactive polymer is well suited for motor applications that require a lightweight motor. For example, the present invention is well suited for applications that require a lightweight motor that can operate at low speeds and yet obtain high-performance from the electroactive polymer materials. There are many applications for a lightweight, low rpm, efficient motor.

The present invention is also suitable for use as artificial muscle. In one example of artificial muscle, a device comprises two or more layers of electroactive polymer are sandwiched together and attached to two rigid plates at opposite edges of each polymer. Electrodes are sealed into the center between each of the polymer layers. Each of the polymer layers may include one or more active areas. An advantage of the layered construction is that multiple electroactive polymer layers may be stacked in parallel in order to produce a desired force that would otherwise not obtainable using a single polymer layer. In addition, the stroke of a linear device may be increased by adding similar linear motion devices in series.

In another embodiment, electroactive polymers suitable for use with the present invention may be rolled or folded into linear transducers and devices that deflect axially while converting between electrical energy and mechanical energy. Since the fabrication of monolithic electroactive polymers is often simpler with fewer numbers of layers, rolled actuators provide an efficient manner of fitting a large number of polymer layers into a compact shape. Rolled or folded transducers and devices typically include two or more layers of polymer. Rolled or folded actuators are applicable wherever linear actuators are used, such as robotic legs and fingers, high force grippers, etc.

Polymers comprising one or more active areas that are rolled into a tubular or multilayer cylinder actuator may be implemented as a piston that expands axially upon actuation. Such an actuator is analogous to a hydraulic or pneumatic piston, and may be implemented in any device or application that uses these traditional forms of linear deflection. An electroactive polymer comprising multiple active areas may also operate at high speeds for a variety of applications including sound generators and acoustic speakers, inkjet printers, fast MEMS switches etc.

8. Conclusion

While this invention has been described in terms of several preferred embodiments, there are alterations, permutations, and equivalents that fall within the scope of this invention which have been omitted for brevity's sake. For example, although the present invention has been described in terms of several specific electrode materials, the present invention is not limited to these materials and in some cases may include air as an electrode. In addition, although the present invention has been described in terms of several preferred polymer materials and geometries, the present invention is not limited to these materials and geometries. It is therefore intended that the scope of the invention should be determined with reference to the appended claims.

What is claimed is:

1. A device for converting between electrical energy and mechanical energy, the device comprising
    an electroactive polymer having a first active area, the first active area comprising
        at least two first active area electrodes and
        a first portion of the electroactive polymer, the first portion arranged in a manner which causes the first portion to deform in response to a change in electric field provided by the at least two first active area electrodes and/or arranged in a manner which causes a change in electric field in response to deflection of the first portion,
        a second portion of the electroactive polymer that stores mechanical input energy in tension,
    wherein the device is arranged such that elastic potential energy of the polymer is substantially independent of deformation of the first portion in response to a change in electric field and/or deformation of the first portion causing a change in electric field.

2. The device of claim 1 wherein the mechanical input energy is substantially equal to the elastic energy required to deflect the first portion of the electroactive polymer for a part of the deformation.

3. The device of claim 2 wherein the mechanical input energy is substantially equal to the elastic energy required to deflect the first portion of the electroactive polymer for an entire deformation corresponding to an actuation.

4. The device of claim 1 wherein the mechanical input energy is less than the elastic energy required to deflect the first portion of the electroactive polymer for a part of the deformation.

5. The device of claim 1 wherein the first portion and the second portion are arranged such that deformation of the first portion includes a direction of expansion that is at least partially linearly aligned with a direction of contraction for the second portion.

6. The device of claim 1 wherein the device is arranged such that elastic potential energy of the polymer remains substantially constant during deformation of the first portion.

7. The device of claim 5 further comprising a second active area, the second active area comprising at least two second active area electrodes and the second portion of the electroactive polymer, the second portion arranged in a manner which causes the second portion to deform in response to a change in electric field provided by the at least two second active area electrodes and/or arranged in a manner which causes a change in electric field in response to deformation of the second portion.

8. The device of claim 7 wherein elastic potential energy stored in the second portion during actuation of the second active area at least partially contributes to the mechanical input energy.

9. The device of claim 7 wherein the first active area and the second active area are arranged such that deformation of the first portion comprises a direction of contraction that is at least partially linearly aligned with a direction of expansion for the second portion.

10. The device of claim 7 wherein the electroactive polymer is a monolithic polymer.

11. The device of claim 10 wherein the monolithic polymer has a substantially symmetrical geometry.

12. The device of claim 10 wherein the first active area and the second active area are arranged substantially symmetrically about a central portion of the monolithic polymer.

13. The device of claim 1 wherein the electroactive polymer is arranged such that elastic potential energy of the electroactive polymer is independent of deformation in response to a change in electric field provided by the at least two first active area electrodes and/or deformation which causes a change in electric field.

14. The device of claim 1 further comprising one or more structures that constrain deformation of the polymer to move along an equipotential line of substantially constant elastic potential energy.

15. The device of claim 14 wherein the mechanical input energy is provided by an external load coupled to the one or more constraining structures.

16. The device of claim 1 wherein the device is included in one of an actuator, a motor and a generator.

17. A device for converting between electrical energy and mechanical energy, the device comprising
at least one electroactive polymer, the at least one electroactive polymer comprising
  a first active area, the first active area comprising at least two first active area electrodes and
  a first portion of the at least one electroactive polymer, the first portion arranged in a manner which causes the first portion to change in response to a change in electric field provided by the at least two first active area electrodes and/or arranged in a manner which causes a change in electric field in response to deformation of the first portion,
one or more structures that constrain deformation of the polymer such that elastic potential energy of the device, which is the sum of the elastic energy in the device, is substantially independent of deformation of the first portion in response to a change in electric field and/or deformation of the first portion causing a change in electric field.

18. The device of claim 17 wherein the at least one electroactive polymer is arranged such that elastic potential energy of the device is substantially constant during deformation of the first portion in response to a change in electric field and/or deformation of the first portion causing a change in electric field.

19. The device of claim 18 further comprising a home position having a lower elastic potential energy than the substantially constant elastic potential energy of the device during deformation of the first portion.

20. The device of claim 17 further comprising a second active area, the second active area comprising at least two second active area electrodes and a second portion of the at least one electroactive polymer, the second portion arranged in a manner which causes the second portion to deflect in response to a change in electric field provided by the at least two second active area electrodes and/or arranged in a manner which causes a change in electric field in response to deformation of the second portion.

21. The device of claim 20 wherein the first active area and the second active area are arranged such that deformation of the first portion includes a direction of contraction that is at least partially linearly aligned with a direction of expansion for the second portion.

22. The device of claim 21 wherein the at least one electroactive polymer is a monolithic polymer that comprises both the first portion and the second portion.

23. The device of claim 20 wherein the first portion of the at least one electroactive polymer is included in a first electroactive polymer that is mechanically coupled to a second electroactive polymer that comprises the second portion.

24. The device of claim 17 wherein the one or more structures constrain deformation of the polymer to move along an equipotential line of substantially constant elastic potential energy.

25. The device of claim 24 wherein the one or more structures provide forces perpendicular to the equipotential line during the deformation.

26. A method of using at least one electroactive polymer, the at least one electroactive polymer comprising a first active area, the first active area comprising at least two first active area electrodes and a first portion of the at least one electroactive polymer, the method comprising deflecting the first portion such that elastic potential energy of the at least one electroactive polymer is substantially constant for the deformation.

27. The method of claim 26 wherein the deformation is in response to a change in electric field provided by the at least two first active area electrodes.

28. The method of claim 26 further comprising deflecting a second portion of the at least one electroactive polymer, the second portion included in a second active area having at least two second active area electrodes.

29. The method of claim 28 wherein deflecting of the second portion is at least partially assisted by elastic energy stored in the first portion.

30. The method of claim 28 wherein application of a voltage difference to the at least two second active area electrodes begins after application of a voltage difference to the at least two first active area electrodes ends.

31. The method of claim 28 wherein application of a voltage difference to the at least two second active area electrodes begins while the first portion of the at least one electroactive polymer is contracting.

32. The method of claim 31 wherein application of a voltage difference to the at least two second active area electrodes begins during the peak elastic contraction of the first portion of the at least one electroactive polymer.

33. The method of claim 28 wherein actuating the second active area includes a direction of expansion that is at least partially linearly aligned with a direction of contraction of the first active area after actuation.

34. The method of claim 28 wherein the first portion and second portion are deformed to move a third portion of the at least one electroactive polymer along a path.

35. The method of claim 26 wherein the first portion is deformed in resonant mode.

* * * * *